(12) United States Patent
Yoon

(10) Patent No.: US 10,923,390 B2
(45) Date of Patent: Feb. 16, 2021

(54) SEMICONDUCTOR DEVICE WITH AIR GAP AND METHOD FOR FABRICATING THE SAME

(71) Applicant: SK hynix Inc., Gyeonggi-do (KR)

(72) Inventor: Jae-Man Yoon, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/807,901

(22) Filed: Mar. 3, 2020

(65) Prior Publication Data

US 2020/0203213 A1 Jun. 25, 2020

Related U.S. Application Data

(63) Continuation of application No. 15/990,254, filed on May 25, 2018, now Pat. No. 10,622,249.

(30) Foreign Application Priority Data

Sep. 29, 2017 (KR) .................. 10-2017-0127595

(51) Int. Cl.
*H01L 27/108* (2006.01)
*H01L 21/768* (2006.01)

(52) U.S. Cl.
CPC .... *H01L 21/7682* (2013.01); *H01L 21/76805* (2013.01); *H01L 21/76895* (2013.01); *H01L 27/10855* (2013.01); *H01L 27/10885* (2013.01); *H01L 27/10888* (2013.01)

(58) Field of Classification Search
CPC ......... H01L 21/7682; H01L 2221/1047; H01L 29/0649; H01L 27/10888; H01L 27/10885; H01L 21/76805; H01L 21/76838

See application file for complete search history.

(56) References Cited

U.S. PATENT DOCUMENTS

| | | | | |
|---|---|---|---|---|
| 8,507,344 | B2* | 8/2013 | Kim | H01L 27/10885 438/270 |
| 9,601,420 | B2* | 3/2017 | Hwang | H01L 21/76229 |
| 2013/0292847 | A1* | 11/2013 | Choi | H01L 21/76897 257/774 |
| 2015/0056801 | A1* | 2/2015 | Park | H01L 21/76847 438/655 |
| 2015/0255466 | A1* | 9/2015 | Hwang | H01L 21/76877 438/586 |
| 2017/0076974 | A1* | 3/2017 | Choi | H01L 23/498 |
| 2018/0301459 | A1* | 10/2018 | Kim | B08B 7/0014 |
| 2019/0027376 | A1* | 1/2019 | Yoon | H01L 21/304 |
| 2019/0088739 | A1* | 3/2019 | Lee | H01L 27/10814 |

* cited by examiner

*Primary Examiner* — Laura M Menz
*Assistant Examiner* — Khatib A Rahman
(74) *Attorney, Agent, or Firm* — IP & T Group LLP

(57) ABSTRACT

A method for fabricating a semiconductor device includes: forming a plurality of bit line structures over a semiconductor substrate; forming a line-type opening between the bit line structures; forming a sacrificial spacer on both sidewalls of the line-type opening; forming a line-type plug filling the line-type opening over the sacrificial spacer; forming a plurality of plug isolation openings that expose the sacrificial spacer by etching a portion of the line-type plug in a direction crossing the bit line structures; forming a plurality of air gaps by removing the exposed sacrificial spacer; removing a remaining line-type plug below the plug isolation openings to form a plurality of island-type plugs; and forming a plug isolation layer inside the plug isolation openings to isolate neighboring island-type plugs from each other.

7 Claims, 31 Drawing Sheets

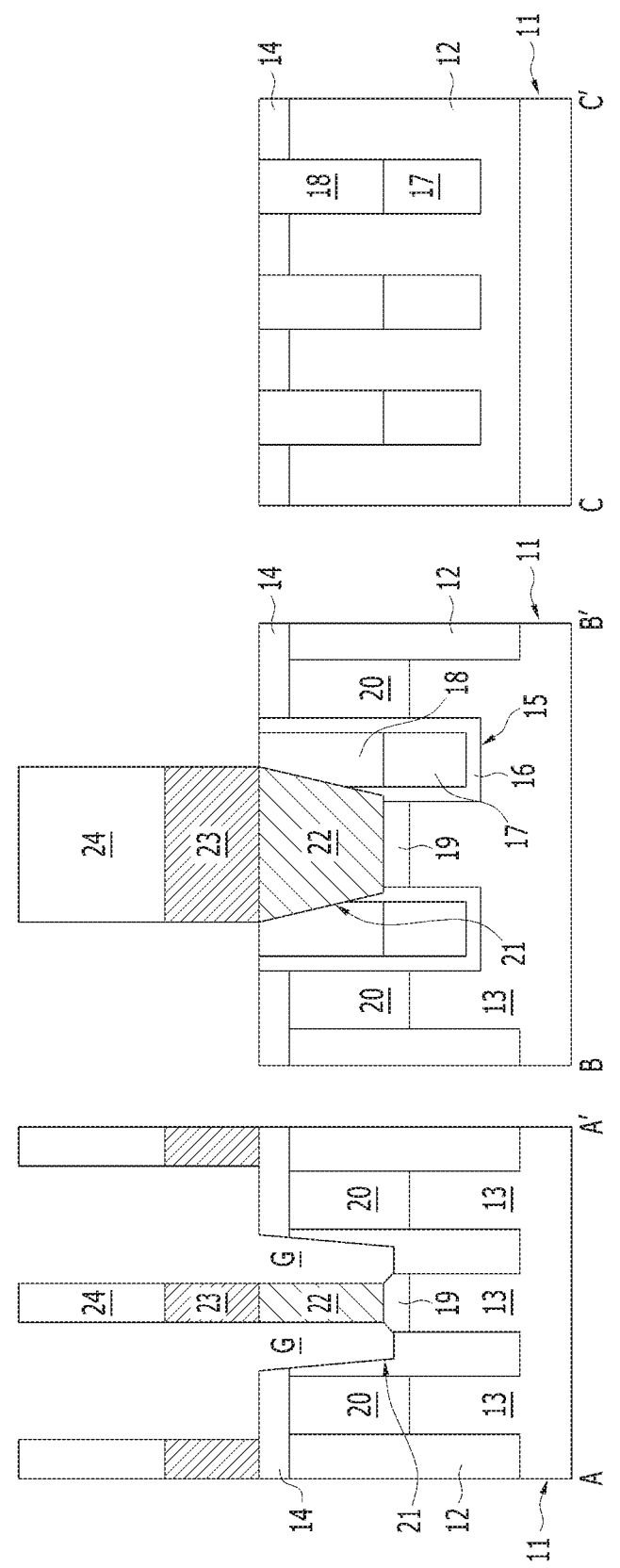

FIG. 5Q
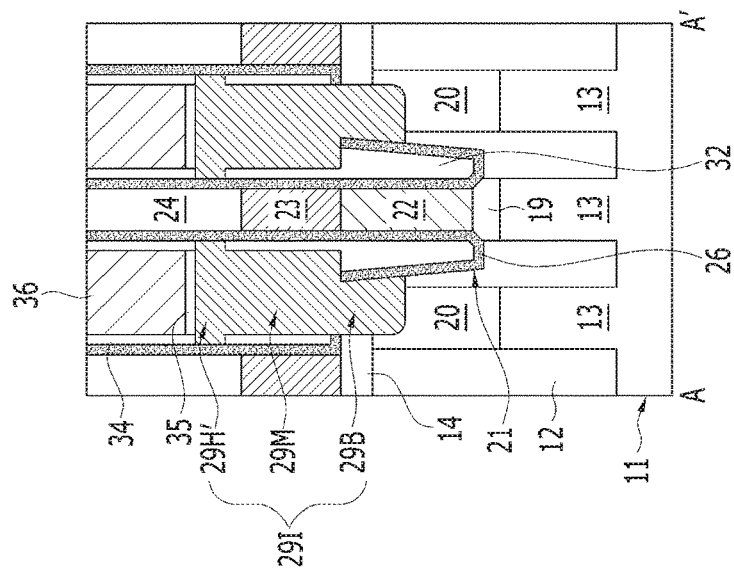
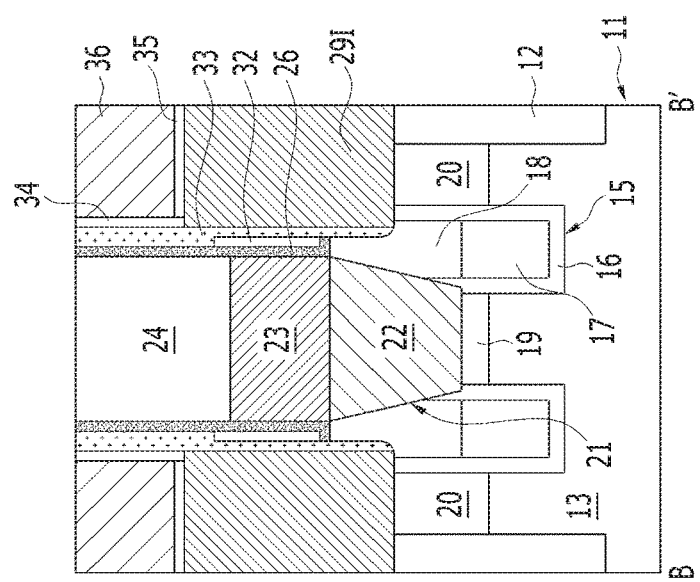
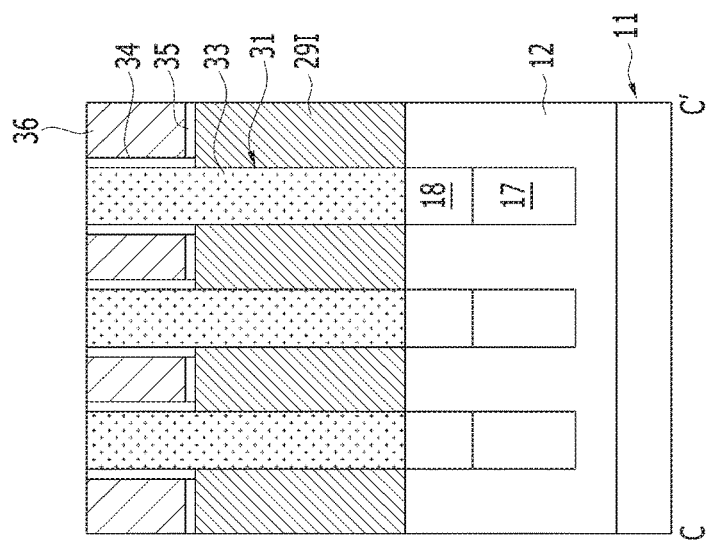

SEMICONDUCTOR DEVICE WITH AIR GAP AND METHOD FOR FABRICATING THE SAME

CROSS-REFERENCE TO RELATED APPLICATIONS

This application is a continuation of U.S. patent application Ser. No. 15/990,254 filed on May 25, 2018, which claims benefits of priority of Korean Patent Application No. 10-2017-0127595 filed on Sep. 29, 2017. The disclosure of each of the foregoing application is incorporated herein by reference in its entirety.

BACKGROUND

1. Field

Exemplary embodiments of the present invention relate to a semiconductor device provided with air gaps, and a method for fabricating the semiconductor device.

2. Description of the Related Art

A dielectric material is formed between neighboring conductive structures in a semiconductor device. As semiconductor devices are highly integrated, the distance between the conductive structures becomes closer to each other. The close distance between the conductive structures increases parasitic capacitance, and the increase in the parasitic capacitance deteriorates performance of the semiconductor device.

To reduce the parasitic capacitance, a dielectric constant of the dielectric material may be decreased. However, since the dielectric material still has a high dielectric constant, there is limitation in the parasitic capacitance.

SUMMARY

Embodiments of the present invention are directed to a semiconductor device capable of reducing parasitic capacitance between neighboring conductive structures, and a method for fabricating the semiconductor device.

In accordance with an embodiment of the present invention, a method for fabricating a semiconductor device includes: forming a plurality of bit line structures over a semiconductor substrate; forming a line-type opening between the bit line structures; forming a sacrificial spacer on both side walls of the line-type opening; forming a line-type plug filling the line-type opening over the sacrificial spacer; forming a plurality of plug isolation openings that expose the sacrificial spacer by etching a portion of the line-type plug in a direction crossing the bit line structures; forming a plurality of air gaps by removing the exposed sacrificial spacer; removing a remaining line-type plug below the plug isolation openings to form a plurality of island-type plugs; and forming a plug isolation layer inside the plug isolation openings to isolate neighboring island-type plugs from each other.

In the forming of the plurality of the air gaps by removing the exposed sacrificial spacer, each of the air gaps may be formed to have a linear shape that is extended in parallel with both sidewalls of each of the bit line structures.

The forming of the plug isolation layer inside the plug isolation openings to isolate the neighboring island-type plugs from each other may include transforming the air gaps into isolated-type air gaps that are disposed between the bit line structures and the island-type plugs, and the isolated-type air gaps may be isolated from each other by the plug isolation layer.

The method may further include, after the forming of the plug isolation layer inside the plug isolation openings to isolate the neighboring island-type plugs from each other: recessing an upper portion of each of the island-type plugs to form a plug recess portion; forming a surrounding spacer on a side all of the plug recess portion; forming an ohmic contact layer on a surface of the recessed island-type plug; and forming a metal plug filling the plug recess portion over the ohmic contact layer.

The forming of the plurality of the plug isolation openings that expose the sacrificial spacer by etching the portion of the line-type plug in the direction crossing the bit line structures may include: forming a plurality of mask layers that are extended in a direction crossing the bit line structures and the line-type plug over the bit line structures and the line-type plug; and etching the line-type plug by using the mask layer and the bit line structures as etch barriers in a depth that the sacrificial spacer is exposed.

The sacrificial spacer may include a material having an etch selectivity with respect to the line-type plug.

The sacrificial spacer may include a titanium nitride.

The forming of the line-type plug filling the line-type opening over the sacrificial spacer may include: forming a polysilicon layer over the bit line structures to fill the line-type opening; and isolating the polysilicon layer to be exposed at the same level as upper surfaces of the bit line structures.

The forming of the plurality of the bit line structures over the semiconductor substrate may include: forming an inter-layer dielectric layer over the semiconductor substrate; forming a bit line contact hole by etching the inter-layer dielectric layer; forming a preliminary plug that fills the bit line contact hole; sequentially forming a conductive layer and a hard mask layer over the preliminary plug and the inter-layer dielectric layer; sequentially etching the hard mask layer, the conductive layer, and the preliminary plug to form the bit line structures where a bit line contact plug, a bit line, and a bit line hard mask layer are sequentially stacked; and forming a bit line spacer on both sidewalls of the bit line, the bit line contact plug, and the bit line hard mask layer.

The air gaps may be formed between the bit line and the island-type plugs and extended vertically to be positioned between the island-type plug and the bit line contact plug.

In accordance with another embodiment of the present invention, a method for fabricating a semiconductor device includes: forming a plurality of bit line structures over a semiconductor substrate; forming a line-type opening between the bit line structures; forming a sacrificial spacer on both sidewalls of the line-type opening; forming a line-type plug filling a space between the bit line structures over the sacrificial spacer; forming a plurality of island-type plugs and a plurality of plug isolation openings by etching the line-type plug in a direction crossing the bit line structures; and forming a plurality of air gaps by removing the sacrificial spacer exposed by the plug isolation openings.

In the forming of the plurality of the air gaps by removing the sacrificial spacer exposed by the plug isolation openings, each of the air gaps may be formed to have a linear shape that is extended in parallel with both sidewalls of each of the bit line structures.

In the forming of the plug isolation layer inside the plug isolation openings to isolate the neighboring island-type plugs from each other, the air gaps may be transformed into isolated-type air gaps that are disposed between the bit line structures and the island-type plugs, and the isolated-type air gaps may be isolated from each other by the plug isolation layer.

The method may further include, after the forming of the plug isolation layer inside the plug isolation openings to isolate the neighboring island-type plugs from each other: recessing an upper portion of each of the island-type plugs to form a plug recess portion; forming a surrounding spacer on a sidewall of the plug recess portion; forming an ohmic contact layer on a surface of the recessed island-type plug; and forming a metal plug filling the plug recess portion over the ohmic contact layer.

The forming of the plurality of the island-type plugs and the plurality of the plug isolation openings by etching the line-type plug in the direction crossing the bit line structures may include: forming a plurality of mask layers that are extended in a direction crossing the bit line structures and the line-type plug over the bit line structures and the line-type plug; and etching the line-type plug by using the mask layer and the bit line structures as etch barriers.

The sacrificial spacer may include a material having an etch selectivity with respect to the line-type plug.

The sacrificial spacer may include a titanium nitride.

The forming of the line-type plug filling the line-type opening over the sacrificial spacer may include: forming a polysilicon layer over the bit line structures to fill the line-type opening; and isolating the polysilicon layer to be exposed at the same level as upper surfaces of the bit line structures.

The forming of the plurality of the bit line structures over the semiconductor substrate may include: forming an inter-layer dielectric layer over the semiconductor substrate; forming a bit line contact hole by etching the inter-layer dielectric layer; forming a preliminary plug that fills the bit line contact hole; sequentially forming a conductive layer and a hard mask layer over the preliminary plug and the inter-layer dielectric layer; sequentially etching the hard mask layer, the conductive layer, and the preliminary plug to form the bit line structures where a bit line contact plug, a bit line, and a bit line hard mask layer are sequentially stacked; and forming a bit line spacer on both sidewalls of the bit line, the bit line contact plug, and the bit line hard mask layer.

The air gaps may be formed between the bit line and the island-type plugs and extended vertically to be positioned between the island-type plug and the bit line contact plug.

The method may further include, after forming a plurality of air gaps by removing the sacrificial spacer exposed by the plug isolation openings: forming a plug isolation layer inside the plug isolation openings to isolate neighboring island-type plugs from each other.

In accordance with yet another embodiment of the present invention, a semiconductor device includes: a plurality of bit line structures formed over a semiconductor substrate to be spaced apart from each other; a bit line spacer formed on both sidewalls of each of the bit line structures; a plurality of island-type plugs formed between the bit line structures to contact the semiconductor substrate; a plug isolation layer formed between the island-type plugs; and a plurality of air gaps formed between the island-type plugs and the bit line spacer.

The air gaps may be isolated-type air gaps disposed between the bit line structures and the island-type plugs.

Each of the bit line structures may include: a bit line contact plug over the semiconductor substrate; a bit line over the bit line contact plug; and a bit line hard mask layer over the bit line.

Each of the air gaps may be formed between the bit line and an island-type plug to be extended to be disposed between the bit line contact plug and the island-type plug.

Each of the island-type plugs may include: a bottom portion which is adjacent to the bit line contact plug with the air gap therebetween; a middle portion which is disposed over the bottom portion to be adjacent to the bit line with the air gap therebetween; and a head portion which is disposed over the middle portion to contact the bit line spacer while capping an upper portion of the air gap.

The island-type plugs may include a polysilicon layer.

The semiconductor device may further include: a plug recess portion which is formed over the island-type plugs in such a manner that upper portions of the island-type plugs are positioned at a lower level than upper portions of the bit line structures; a surrounding spacer suitable for surrounding a sidewall of the plug recess portion; an ohmic contact layer formed on surfaces of the island-type plugs; and a metal plug which is formed over the ohmic contact layer to fill the plug recess portion.

The semiconductor device may further include: an isolation layer which is formed to define a plurality of active regions in the semiconductor substrate; a gate trench which traverses the active regions and the isolation layer; and a buried word line which is formed inside the gate trench.

These and other features and advantages of the present invention will become apparent from the following detailed description in conjunction with the accompanying drawings.

DETAILED DESCRIPTION

Figure 1:
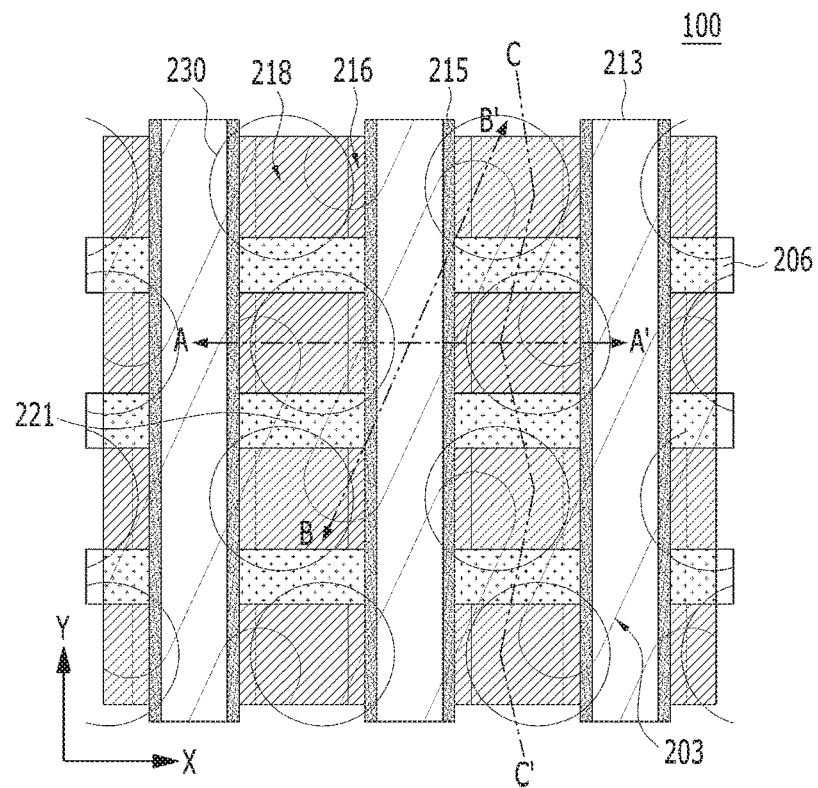
FIG. 1 is a plan view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Although the terms such as first and second may be used to describe various components, the components are not limited by the terms, and the terms are used only to distinguish components from other components.

The terminology used herein is for the purpose of describing particular embodiments only and is not intended to be limiting of the present invention. As used herein, singular forms are intended to include the plural forms as well, unless the context clearly indicates otherwise.

It will be further understood that the terms comprises, comprising, includes, and including when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. However, it is noted that the present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 2A:
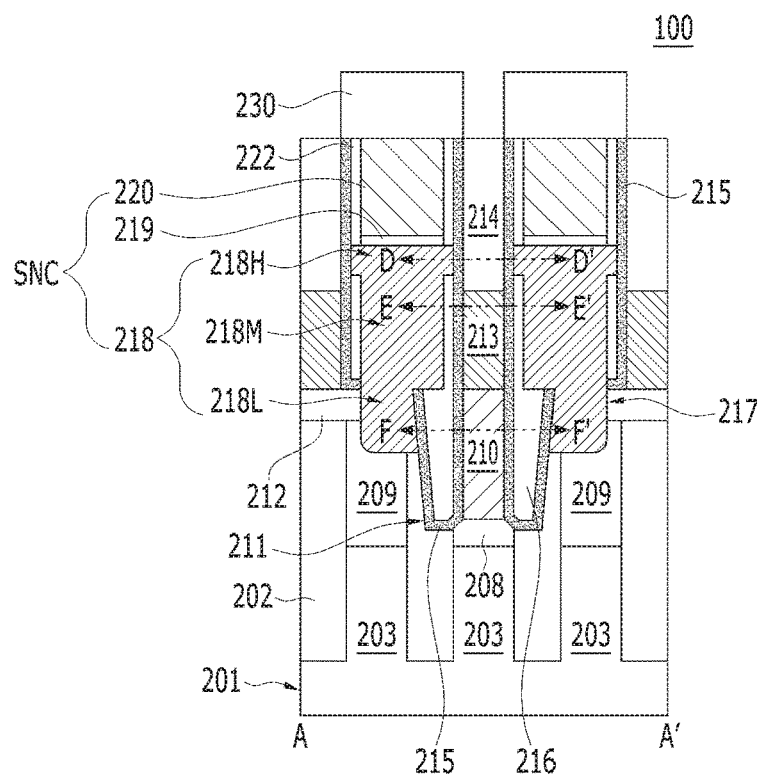
FIG. 2A is a cross-sectional view of the semiconductor device taken along a line A-A' shown in FIG. 1.
Figure 2B:
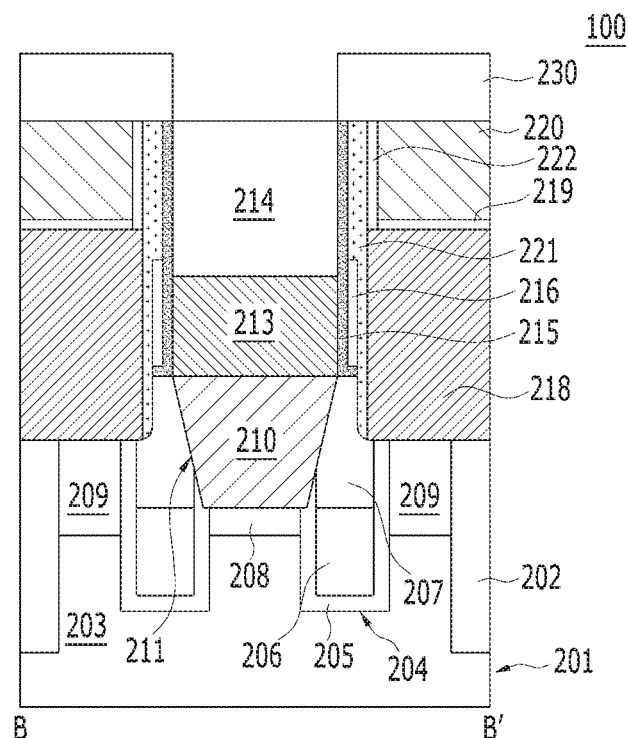
FIG. 2B is a cross-sectional view of the semiconductor device taken along a line B-B' shown in FIG. 1.
Figure 2C:
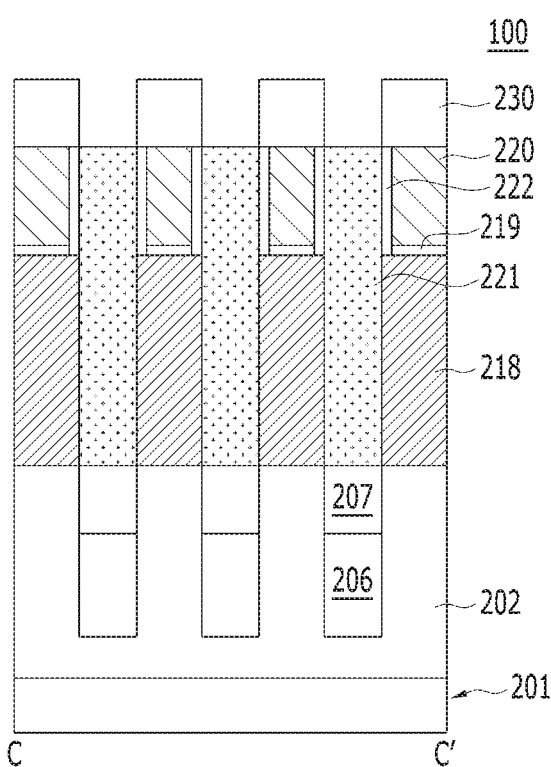
FIG. 2C is a cross-sectional view of the semiconductor device taken along a line C-C' shown in FIG. 1.

FIG. 1 is a plan view illustrating a semiconductor device in accordance with an embodiment of the present invention. FIG. 2A is a cross-sectional view of the semiconductor device taken along a line A-A' shown in FIG. 1. FIG. 2B is a cross-sectional view of the semiconductor device taken along a line B-B' shown in FIG. 1. FIG. 2C is a cross-sectional view of the semiconductor device taken along a line C-C' shown in FIG. 1.

The semiconductor device 100 may include a plurality of memory cells. Each of the memory cells may include a cell transistor including a buried word line 206, a bit line 213, and a memory element 230.

Hereafter, the semiconductor device 100 may be described in detail.

An isolation layer 202 and an active region 203 may be formed in a substrate 201. A plurality of active regions 203 may be defined by the isolation layer 202. The substrate 201 may be formed of or include a material that is suitable for semiconductor processing. The substrate 201 may include a semiconductor substrate. The substrate 201 may be formed of a material containing silicon. The substrate 201 may include silicon, monocrystalline silicon, polycrystalline silicon (i.e., polysilicon), amorphous silicon, silicon germanium, monocrystalline silicon germanium, polycrystalline silicon germanium, carbon-doped silicon, combinations thereof, or a multi-layer of them. The substrate 201 may include another semiconductor material, such as germanium. The substrate 201 may include a III/V-group semiconductor substrate, e.g., a chemical compound semiconductor substrate such as a gallium arsenide (GaAs). The substrate 201 may include a Silicon On Insulator (SOI). The isolation layer 202 may be formed through a Shallow Trench Isolation (STI).

A gate trench 204 may be formed in the substrate 201. A gate dielectric layer 205 may be formed on the surface of the gate trench 204. A buried word line 206 filling a portion of the gate trench 204 may be formed over the gate dielectric layer 205. A gate capping layer 207 may be formed over the buried word line 206. The top surface of the buried word line 206 may be lower than the top surface of the substrate 201. The buried word line 206 may include a low-resistivity metal material. The buried word line 206 may include a titanium nitride and tungsten that are sequentially stacked one on the other. According to another embodiment of the present invention, the buried word line 206 may be formed of a titanium nitride (TiN) only.

A first impurity region 208 and a second impurity region 209 may be formed in the substrate 201. The first impurity region 208 and the second impurity region 209 may be spaced apart from each other by the gate trench 204. The first impurity region 208 and the second impurity region 209 may be referred to as source and drain regions. The first impurity region 208 and the second impurity region 209 may include an N-type impurity, such as arsenic (As) or phosphorus (P). As a result, the buried word line 206, the first impurity region 208, and the second impurity region 209 may become a cell transistor. The cell transistor may improve a short-channel effect due to the presence of the buried word line 206.

A bit line contact plug 210 may be formed over the substrate 201. The bit line contact plug 210 may be coupled to the first impurity region 208. The bit line contact plug 210 may be positioned inside a bit line contact hole 211. The bit line contact hole 211 may be formed in a hard mask layer 212. The hard mask layer 212 may be formed over the substrate 201. The bit line contact hole 211 may expose the first impurity region 208. The bottom surface of the bit line contact plug 210 may be lower than the top surface of the substrate 201. The bit line contact plug 210 may be formed of polysilicon or a metal material. A portion of the bit line contact plug 210 may have a narrower line width than the diameter of the bit line contact hole 211. The bit line 213 may be formed over the bit line contact plug 210. A bit line hard mask 214 may be formed over the bit line 213. The stacked structure of the bit line contact plug 210, the bit line 213, and the bit line hard mask 214 may be called a bit line structure BL. The bit line 213 may have a linear shape that is extended in a direction crossing the buried word line 206. A portion of the bit line 213 may be coupled to the bit line contact plug 210. From the perspective of the line A-A', the bit line 213 and the bit line contact plug 210 may have the same line width. Therefore, the bit line 213 may be extended in one direction while covering the bit line contact plug 210. The bit line 213 may be made of or include a metal material. The bit line hard mask 214 may be made of or include a dielectric material.

A bit line spacer 215 may be formed on the sidewall of the bit line structure BL. The bottom portion of the bit line spacer 215 may be extended to be formed on both sidewalls of the bit line contact plug 210. The bit line spacer 215 may be made of or include a silicon oxide, a silicon nitride, or a combination thereof.

A plurality of air gaps 216 may be formed on the sidewall of the bit line spacer 215.

A storage node contact plug SNC may be formed between the neighboring bit line structures BL. The storage node contact plug SNC may be formed in a storage node contact hole 217. The storage node contact hole 217 may have a high aspect ratio. The high aspect ratio may have a height-to-width aspect ratio greater than 10:1. The storage node contact plug SNC may be coupled to the second impurity region 209. The storage node contact plug SNC may include an island-type plug 218 and an upper plug 220. The storage node contact plug SNC may further include an ohmic contact layer 219 between the island-type plug 218 and the upper plug 220. The ohmic contact layer 219 may be made of or include a metal silicide. The upper plug 220 may be made of or include a metal material.

From a perspective view in parallel with the bit line structure BL, a plug isolation layer 221 may be formed between the neighboring island-type plugs 218. The plug isolation layer 221 may be formed between the neighboring bit line structures BL, and the plug isolation layer 221 may be able to provide the storage node contact hole 217 along with the hard mask layer 212. The air gaps 216 may have an isolated form due to the presence of the plug isolation layer 221. Referring to FIG. 1, the air gaps 216 may be formed in plural along both sidewalls of each bit line structure BL. Since the plug isolation layer 221 is disposed between the air gaps 216, the neighboring air gaps 216 may be discontinuous. Referring to FIG. 2A, the air gaps 216 may be disposed between the bit line contact plug 210 and the island-type plug 218. The air gaps 216 may be extended in a vertical direction to be disposed between the bit line 213 and the island-type plug 218.

The upper plug 220 may be surrounded by a surrounding spacer 222. The surrounding spacer 222 may be made of or include a silicon nitride.

The memory element 230 may be formed over the upper plug 220. The memory element 230 may include a capacitor including a storage node. The storage node may include a pillar-type storage node. Although not illustrated, a dielectric layer and a plate node may be further formed over the storage node. The storage node may be a cylinder-type storage node, other than the pillar-type storage node.

Figure 3A:
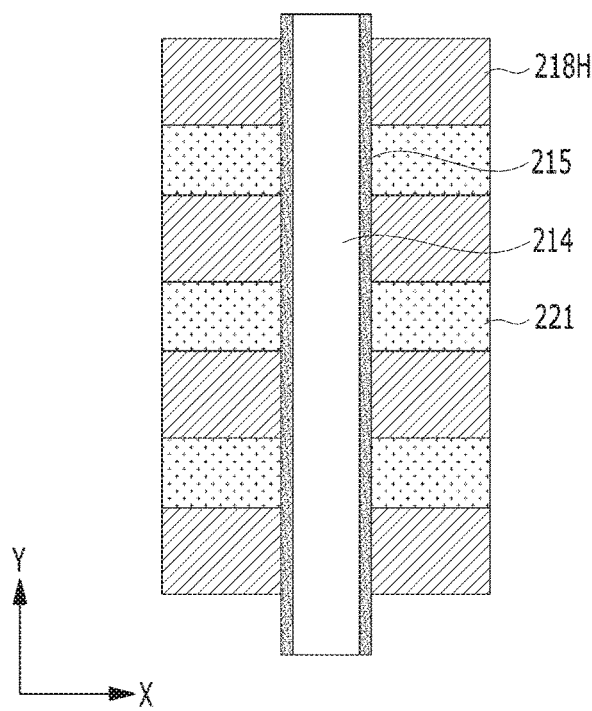
FIG. 3A is a plan view of the semiconductor device taken along a line D-D' shown in FIG. 2A.
Figure 3B:
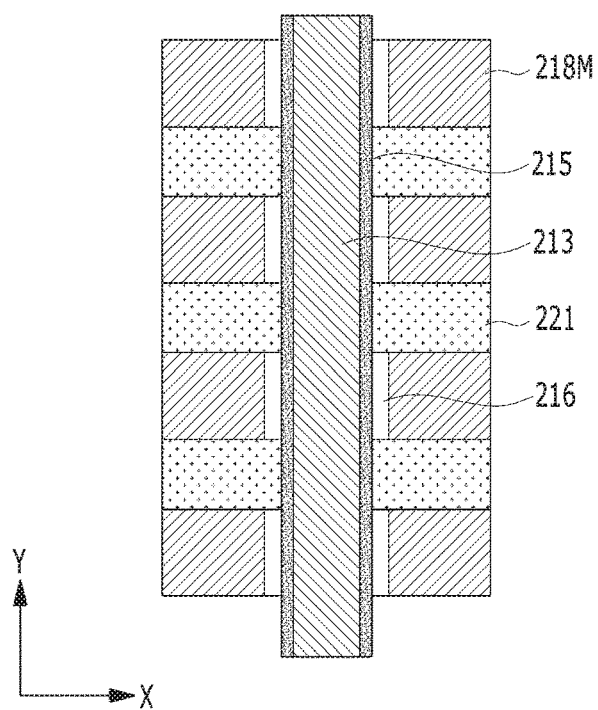
FIG. 3B is a plan view of the semiconductor device taken along a line E-E' shown in FIG. 2A.
Figure 3C:
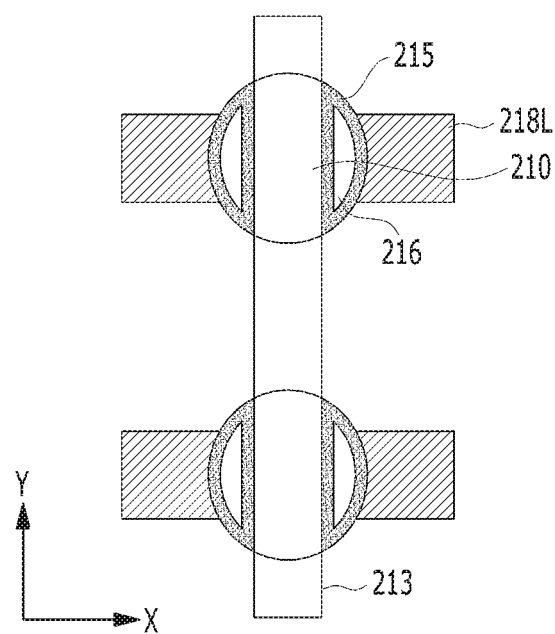
FIG. 3C is a plan view of the semiconductor device taken along a line F-F' shown in FIG. 2A.

FIGS. 3A to 3C illustrate the island-type plug 218 in detail. FIG. 3A is a plan view of the semiconductor device taken along a line D-D' shown in FIG. 2A. FIG. 3B is a plan view of the semiconductor device taken along a line E-E' shown in FIG. 2A. FIG. 3C is a plan view of the semiconductor device taken along a line F-F' shown in FIG. 2A.

Referring to FIG. 2A and FIGS. 3A to 3C, the island-type plug 218 may include a bottom portion 218L, a middle portion 218M, and a head portion 218H that are stacked. The stacked structure of the middle portion 218M and the head portion 218H may have a 'T' shape. The head portion 218H of the island-type plug 218 may have a relatively wider surface area than the middle portion 218M. The middle portion 218M may be adjacent to the air gaps 216, and the head portion 218H may cover the upper portion of the air gaps 216. The bottom portion 218L of the island-type plug 218 may be adjacent to the bit line contact plug 210. The middle portion 218M of the island-type plug 218 may be adjacent to the bit line 213 and a bottom part of the bit line hard mask 214 which is surrounded by the air gaps 216. The head portion 218H of the island-type plug 218 may be adjacent to the bit line hard mask 214 above its bottom part which is surrounded by the air gaps 216. The air gaps 216 may be disposed between the middle portion 218M of the island-type plug 218 and the bit line 213. The air gaps 216 may be extended to be disposed between the bottom portion 218L of the island-type plug 218 and the bit line contact plug 210. The air gaps 216 may not be disposed between the head portion 218H of the island-type plug 218 and the bit line hard mask 214. The air gaps 216 may be disposed between the middle portion 218M of the island-type plug 218 and the bottom part of the bit line hard mask 214.

From a perspective view of a Y direction, the neighboring air gaps 216 may have an isolated form. The air gaps 216 may be isolated from each other due to the presence of the plug isolation layer 221 (refer to FIG. 3B).

Figure 4A:
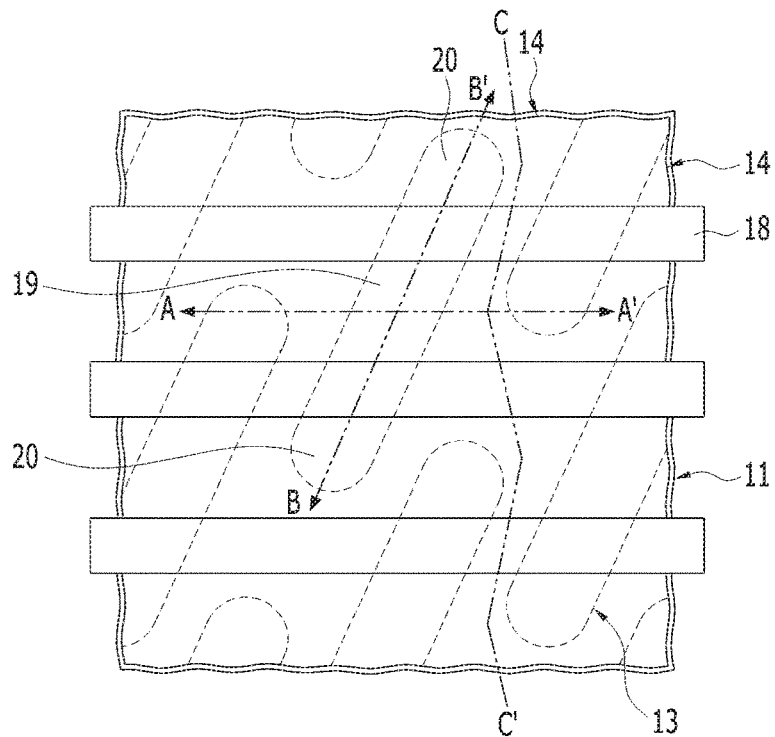
FIGS. 4A to 4Q are plan views illustrating an example of a method for fabricating the semiconductor device in accordance with an embodiment of the present invention.
Figure 4B:
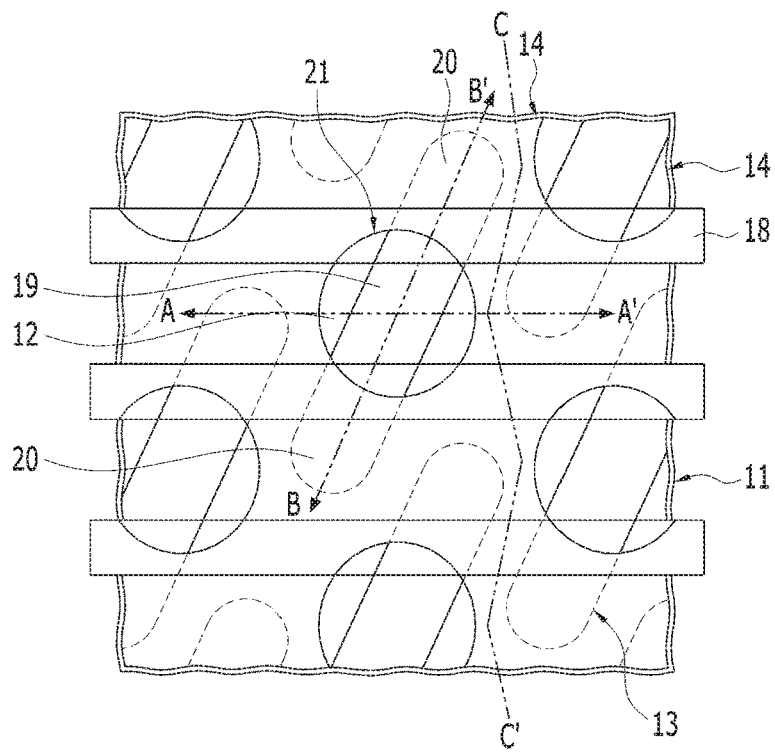
Figure 4C:
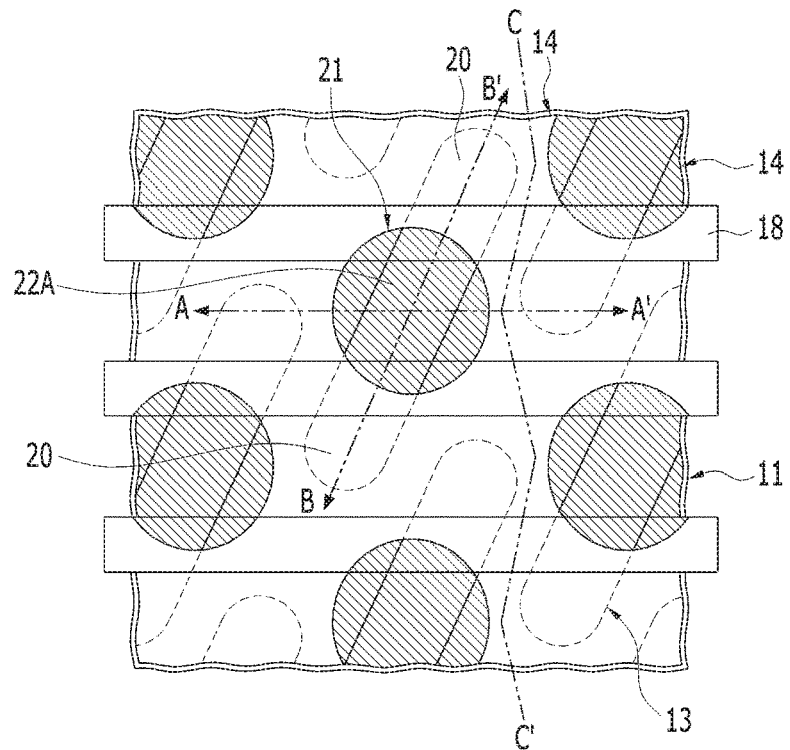
Figure 4D:
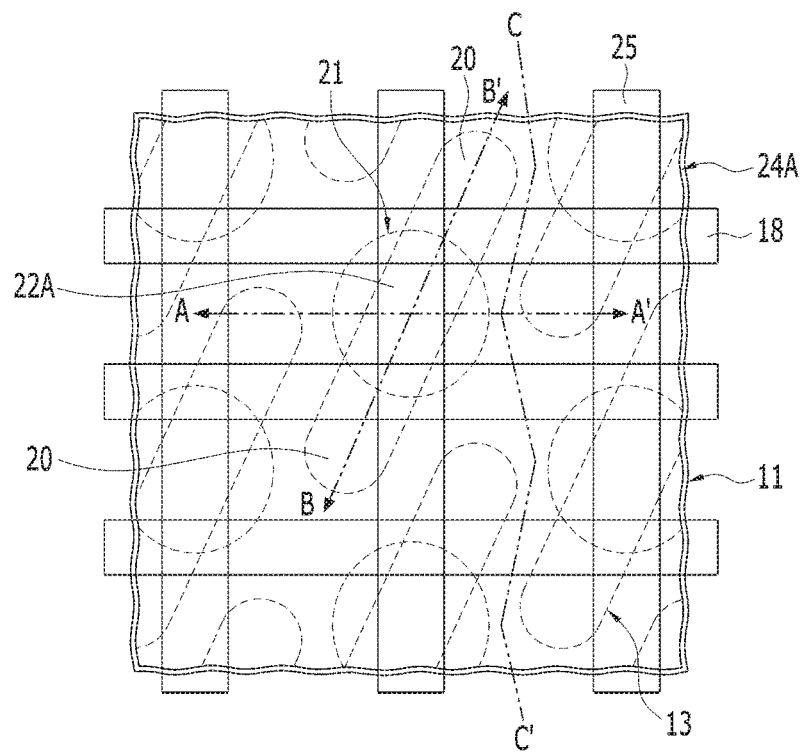
Figure 4E:
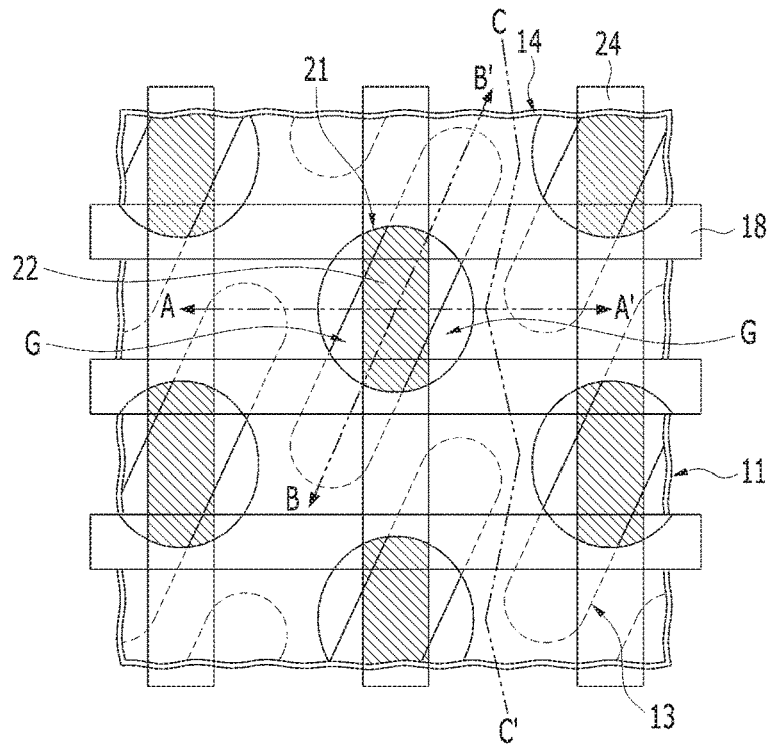
Figure 4F:
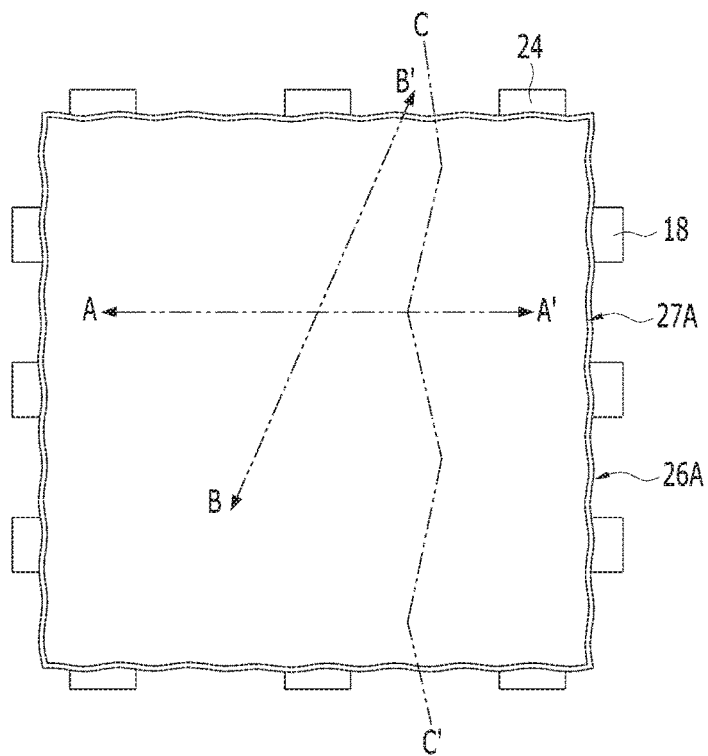
Figure 4G:
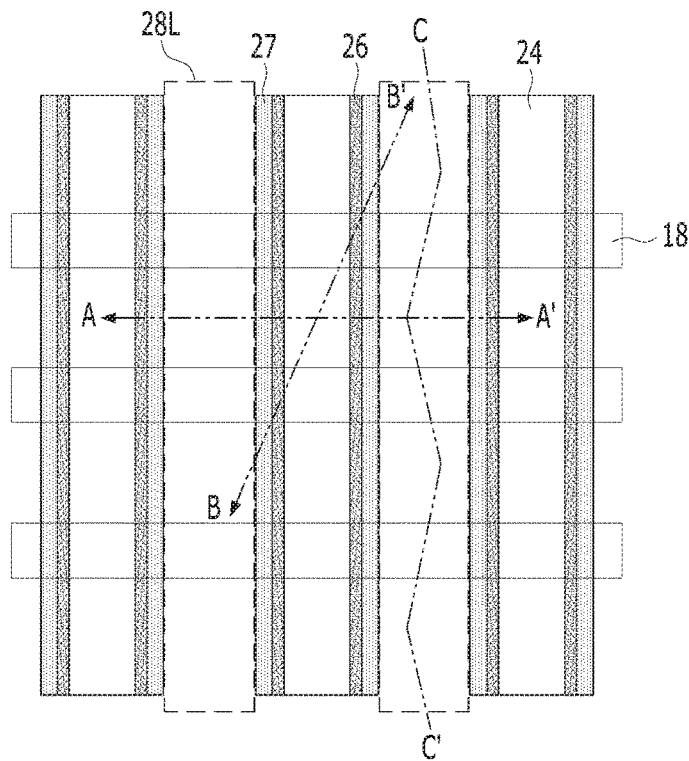
Figure 4H:
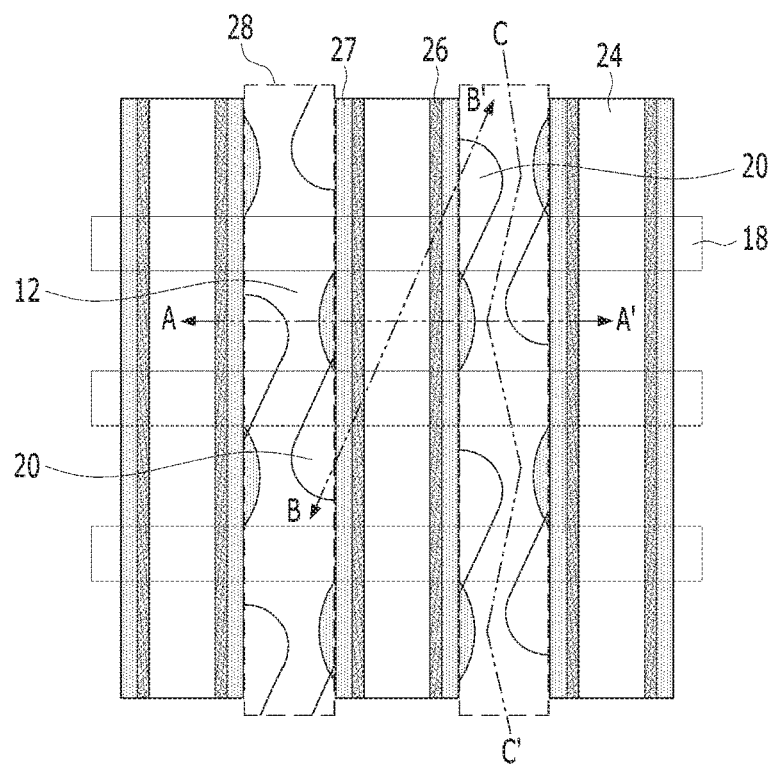
Figure 4I:
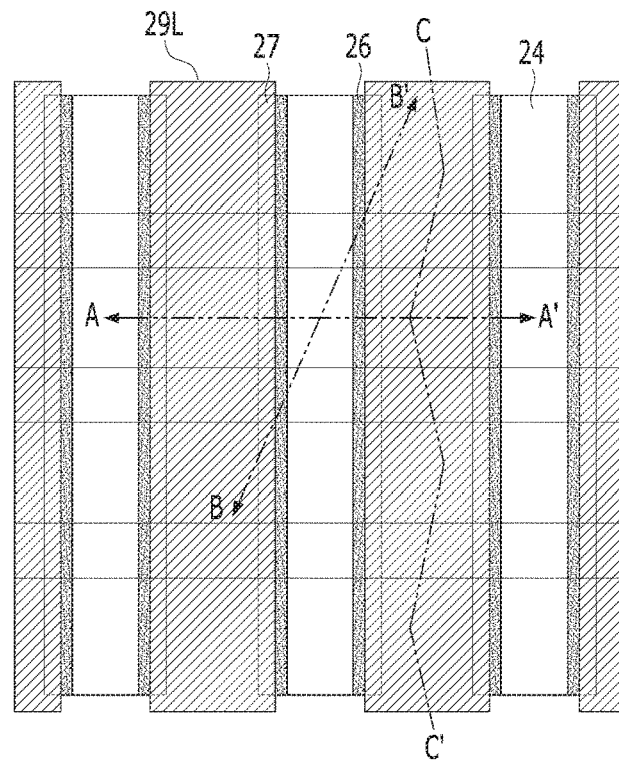
Figure 4J:
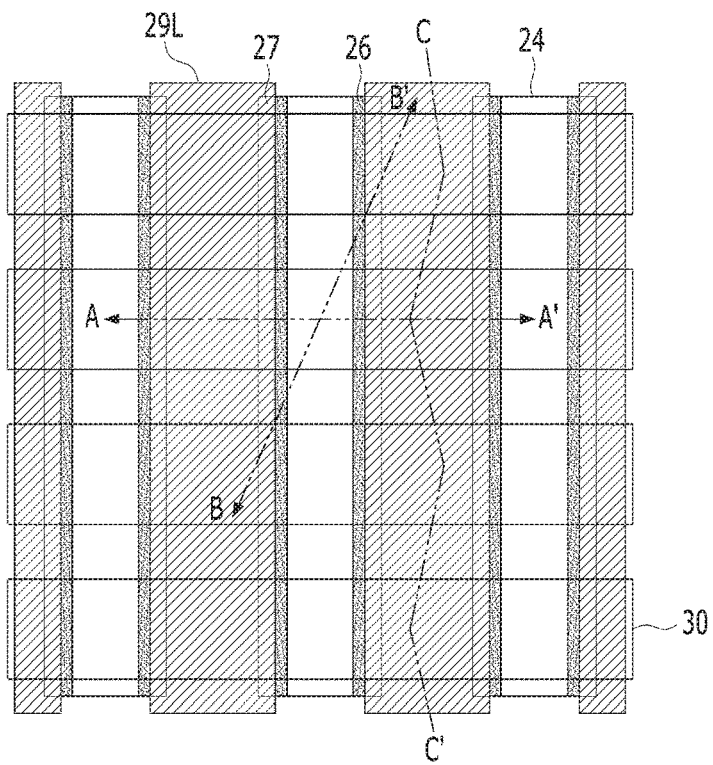
Figure 4K:
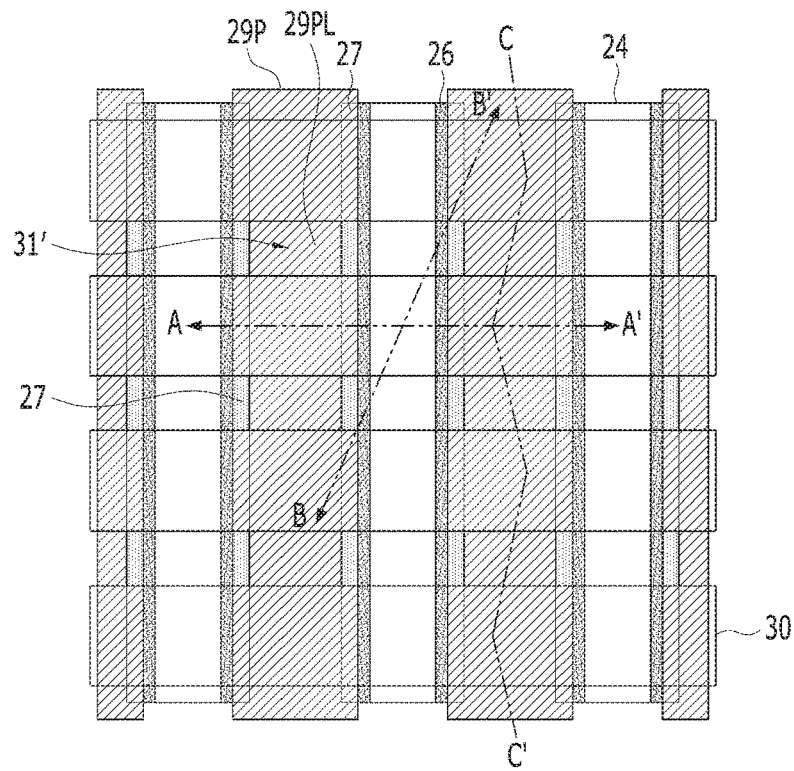
Figure 4L:
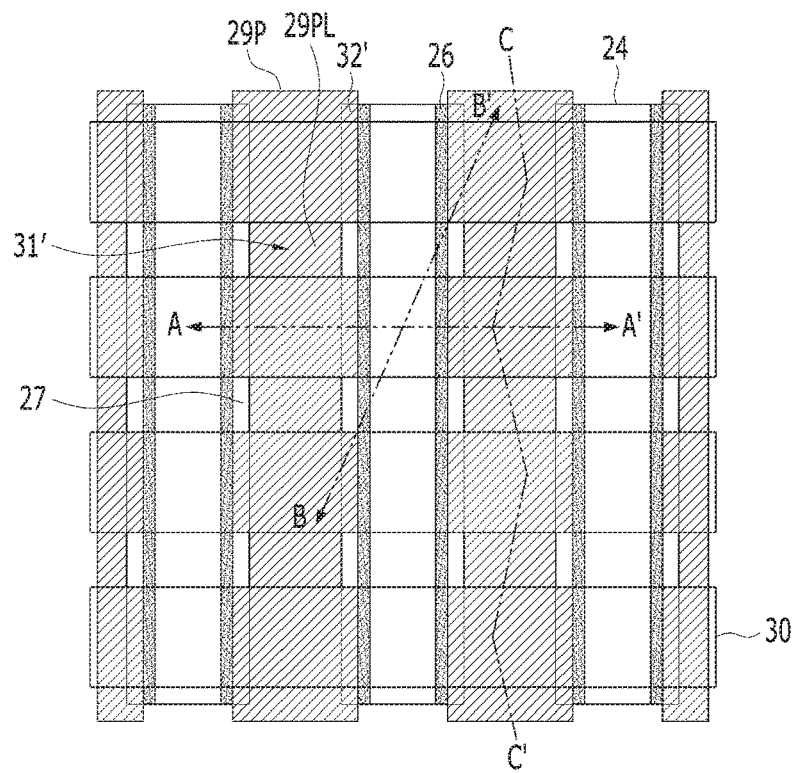
Figure 4M:
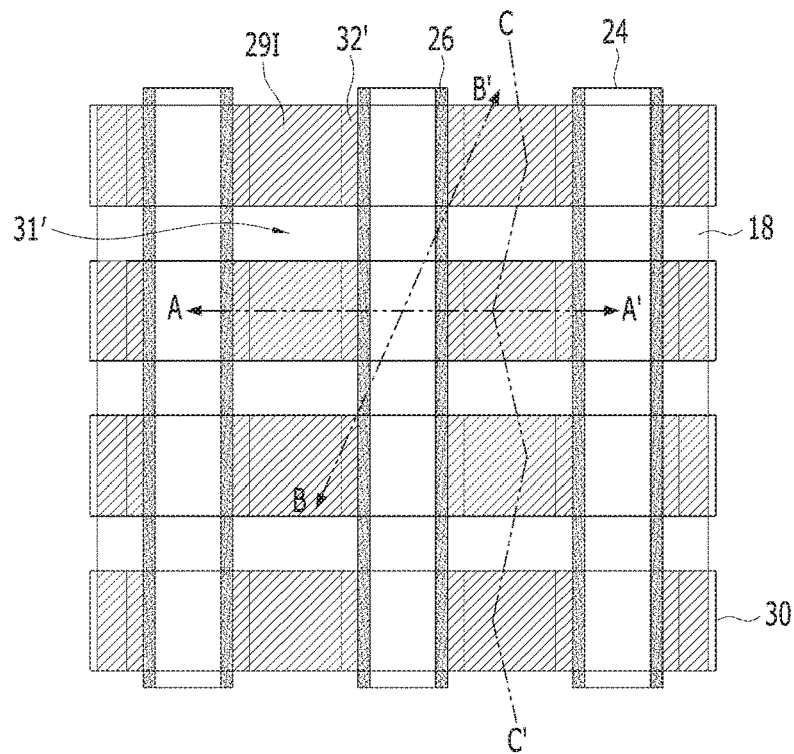
Figure 4N:
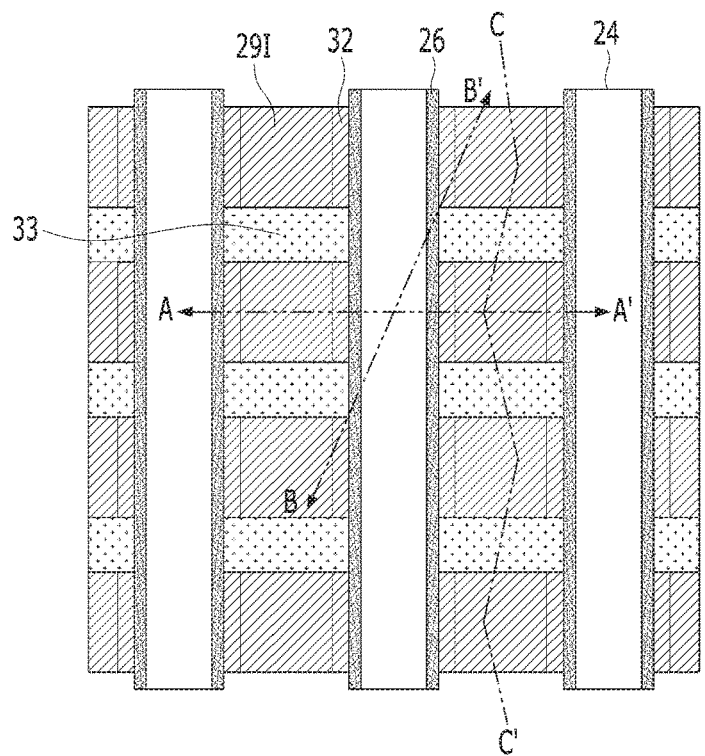
Figure 4O:
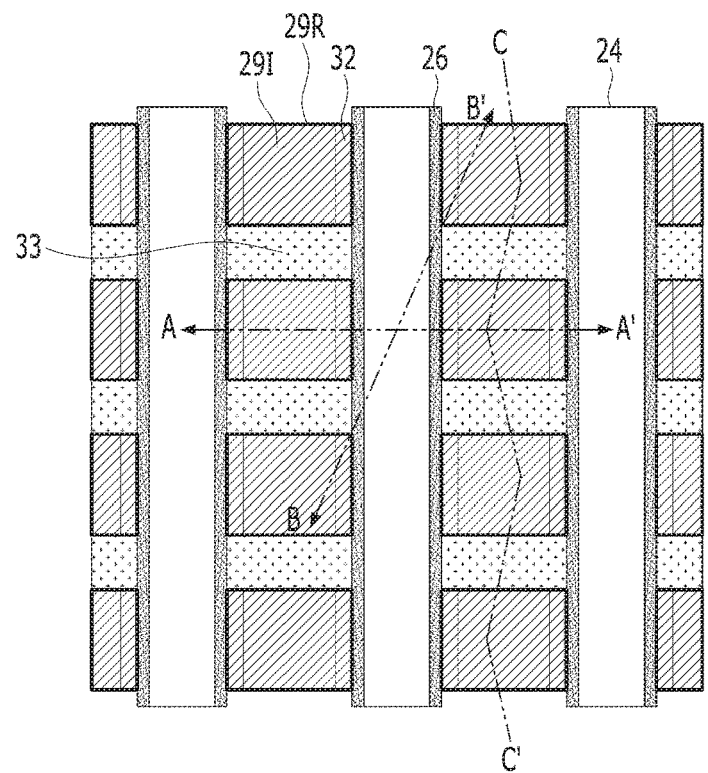
Figure 4P:
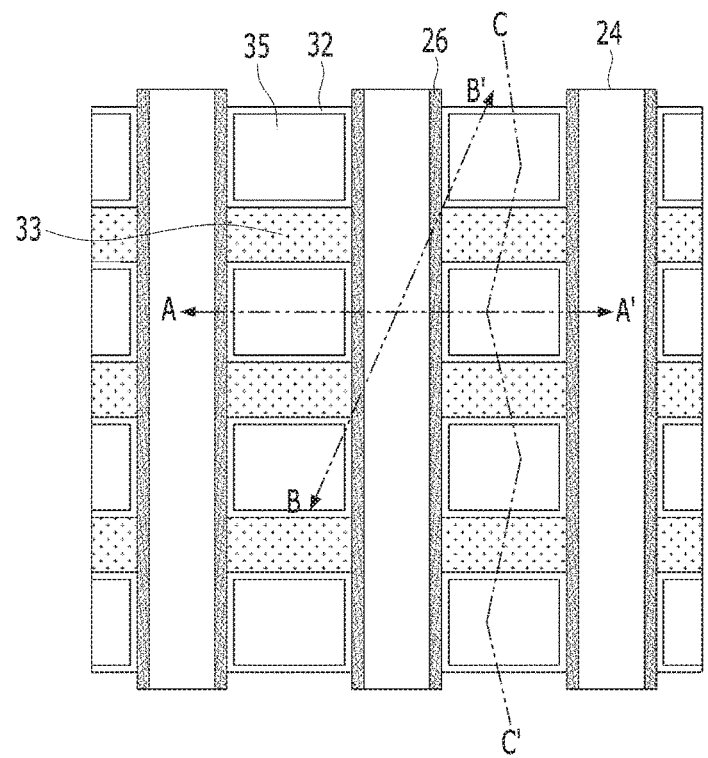
Figure 4Q:
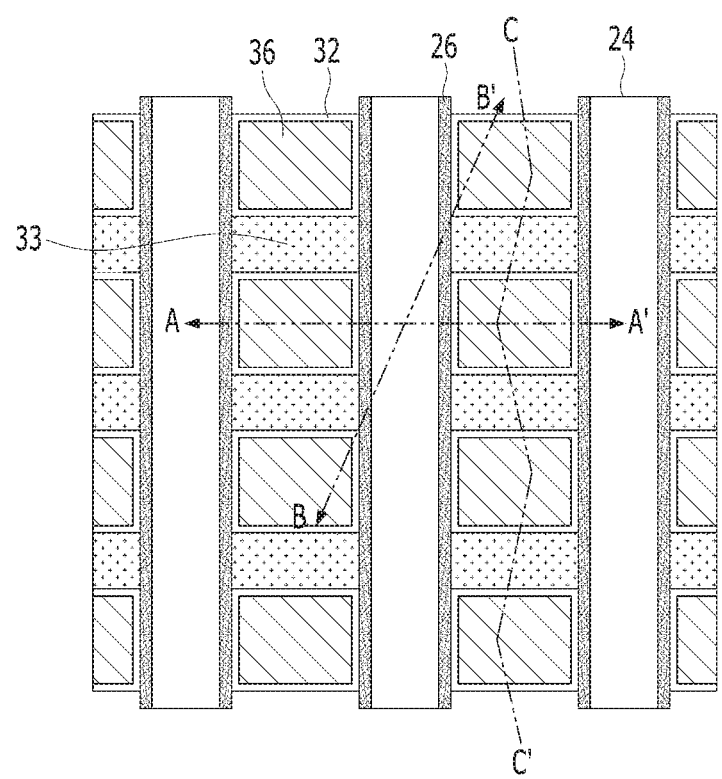
Figure 5A:
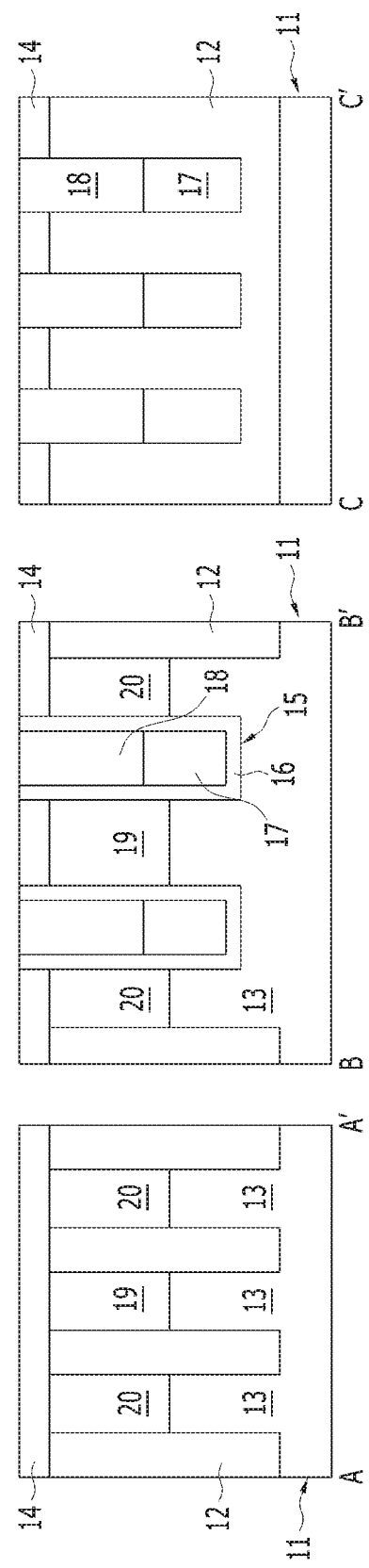
FIGS. 5A to 5Q are cross-sectional views of the method for fabricating the semiconductor device taken along lines A-A', B-B' and C-C' shown in FIGS. 4A to 4Q.

FIGS. 4A to 5Q illustrate an example of a method for fabricating the semiconductor device in accordance with an embodiment of the present invention. A Dynamic Random Access Memory (DRAM) may include a cell region where memory cells are formed and a peripheral circuit region for controlling the input/output of data to/from the memory cells. When a plurality of elements are formed in the cell region and the peripheral circuit region, some of the elements may be formed concurrently, that is, some of the elements may be formed to be merged. FIGS. 4A to 4Q are plan views illustrating an example of a method for fabricating the semiconductor device in accordance with an embodiment of the present invention. FIGS. 5A to 5Q are cross-sectional views of the method for fabricating the semiconductor device taken along lines A-A', B-B' and C-C' shown in FIGS. 4A to 4Q.

Referring to FIGS. 4A and 5A, an isolation layer 12 may be formed in a substrate 11. An active region 13 may be defined by the isolation layer 12. The isolation layer 12 may be formed through a Shallow Trench Isolation (STI) process. The STI process may be performed as follows. An isolation trench (no reference numeral is given) may be formed by etching the substrate 11. The isolation trench may be filled with a dielectric material so as to form the isolation layer 12. The isolation layer 12 may be made of or include a silicon oxide, a silicon nitride, or a combination thereof. The isolation trench may be filled with a dielectric material through a deposition process including, for example, a Chemical Vapor Deposition (CVD) process. Then, a planarization process, such as a Chemical-Mechanical Polishing (CMP) process, may be used to remove any excess dielectric material.

Subsequently, a buried word line structure may be formed inside the substrate 11. The buried word line structure may include a gate trench 15, a gate dielectric layer 16 which covers the bottom surface and sidewall of the gate trench 15, a buried word line 17 which fills a portion of the gate trench 15 over the gate dielectric layer 16, and a gate capping layer 18 which is formed over the buried word line 17.

The buried word line structure may be formed through the following method.

First of all, the gate trench 15 may be formed inside the substrate 11. The gate trench 15 may have a linear shape traversing the active region 13 and the isolation layer 12. The gate trench 15 may be formed by forming a mask pattern (not shown) over the substrate 11 and performing an etch process by using the mask pattern as an etch mask. To form the gate trench 15, a hard mask layer 14 may be used as an etch barrier. The hard mask layer 14 may have a patterned shape that is patterned by the mask pattern. The hard mask layer 14 may be made of or include a silicon oxide. The hard mask layer 14 may be made or include TEOS (TetraEthylOrthoSilicate). The bottom surface of the gate trench 15 may be disposed at a higher level than the bottom surface of the isolation layer 12. The gate trench 15 may have a depth that is sufficient to make the average cross-sectional area of a buried word line electrode, which is to be formed subsequently, as big as possible for reducing the resistance of the gate electrode. According to another embodiment of the present invention, a bottom edge of the gate trench 15 may have a curvature for minimizing protrusion and depression at the bottom portion of the gate trench 15 during the filling of the gate electrode. Hence, filling of the gate electrode may be performed more easily.

Although not illustrated, the active region below the gate trench 15 may be protruded by recessing a portion of the isolation layer 12. For example, the isolation layer 12 below the gate trench 15 may be selectively recessed in the direction of the line B-B' shown in FIG. 1. As a result, a fin region (no reference numeral is given) may be formed below the gate trench 15. The fin region may become a portion of a channel region.

Subsequently, the gate dielectric layer 16 may be formed over the bottom surface and sidewalls of the gate trench 15. Before the gate dielectric layer 16 is formed, etch damage on the surface of the gate trench 15 may be cured. For example, a sacrificial oxide may be formed through a thermal oxidation process and then the sacrificial oxide may be removed.

The gate dielectric layer 16 may be formed through a thermal oxidation process. For example, the gate dielectric layer 16 may be formed by oxidizing the bottom and sidewalls of the gate trench 15.

According to another embodiment of the present invention, the gate dielectric layer 16 may be formed through a deposition process, such as a Chemical Vapor Deposition (CVD) process or an Atomic Layer Deposition (ALD) process. Examples, of suitable materials for the gate dielectric layer 16 may include a high-k material, an oxide, a nitride, an oxynitride, or a combination thereof. The high-k material may include a hafnium-containing material. Examples of hafnium-containing materials may include a hafnium oxide, a hafnium silicon oxide, a hafnium silicon oxynitride, or a combination thereof. According to another embodiment of the present invention, the high-k material may be or include a lanthanum oxide, a lanthanum aluminum oxide, a zirconium oxide, a zirconium silicon oxide, a zirconium silicon oxynitride, an aluminum oxide, and combinations thereof. As for the high-k material, another known high-k material may be selectively used.

According to another embodiment of the present invention, the gate dielectric layer 16 may be formed by depositing a liner polysilicon layer followed by radical-oxidizing of the liner polysilicon layer.

According to yet another embodiment of the present invention, the gate dielectric layer 16 may be formed by depositing a liner silicon nitride layer followed by radical-oxidizing the liner silicon nitride layer.

Subsequently, the buried word line 17 may be formed over the gate dielectric layer 16. To form the buried word line 17, a recessing process may be performed after a conductive layer (not shown) is formed to fill the gate trench 15. As an example, the recessing process may be an etch-back process. As another example, the recessing process may include a Chemical Mechanical Polishing (CMP) process and an etch-back process that are performed sequentially. The buried word line 17 may have a recessed shape filling a portion of the gate trench 15. The top surface of the buried word line 17 positioned at a lower level than the top surface of the active region 13. The buried word line 17 may be made of or include a metal, a metal nitride, or a combination thereof. For example, the buried word line 17 may be formed of a titanium nitride (TiN), tungsten (W), or a titanium nitride/tungsten (TiN/W). The titanium nitride/tungsten (TiN/W) may be formed by conformally forming a titanium nitride and then filling a portion of the gate trench 15 with tungsten. The buried word line 17 may be formed of a titanium nitride (TiN) alone, and this may be called a buried word line 17 of a TiN-only structure.

Subsequently, the gate capping layer 18 may be formed over the buried word line 17. The gate capping layer 18 may be made of or include a dielectric material. The remaining portion of the gate trench 15 which is not filled with the buried word line 17 may be filled with the gate capping layer 18 over the buried word line 17. The gate capping layer 18 may be made of or include a silicon nitride. According to another embodiment of the present invention, the gate capping layer 18 may be made of or include a silicon oxide. According to yet another embodiment of the present invention, the gate capping layer 18 may have an NON (nitride-oxide-nitride) structure. The top surface of the gate capping layer 18 may be positioned at the same level as the top surface of the hard mask layer 14. To this end, when the gate capping layer 18 is formed, a CMP process may be performed.

After the gate capping layer 18 is formed, first and second impurity regions 19 and 20 may be formed. The first and second impurity regions 19 and 20 may be formed through a doping process, such as an implantation process. The first and second impurity regions 19 and 20 may be doped with an impurity of the same conductive type. The first and second impurity regions 19 and 20 may have the same depth. According to another embodiment of the present invention, the first impurity region 19 may be deeper than the second impurity region 20. The first and second impurity regions 19 and 20 may be referred to as source and drain regions, respectively. The first impurity region 19 may be a region accessible by a bit line contact plug. The second impurity region 20 may be a region accessible by a storage node contact plug.

The buried word line 17, the first impurity region 19, and the second impurity region 20 may form a cell transistor of a memory cell.

Figure 5B:
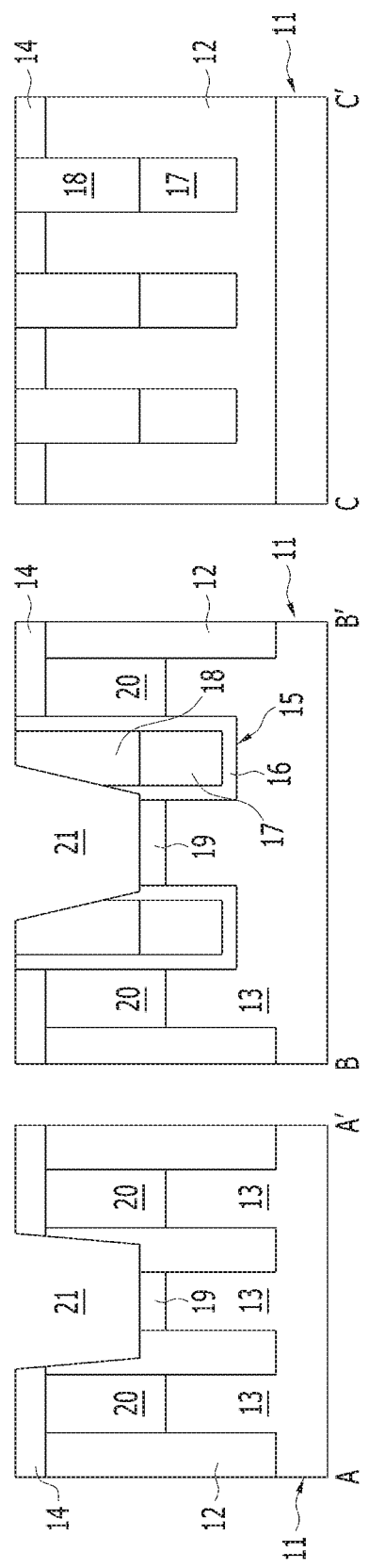

Referring to FIGS. 4B and 5B, a first contact hole 21 may be formed. To form the first contact hole 21, the hard mask layer 14 may be etched by using a contact mask (not shown). From a perspective view of a plan view, the first contact hole 21 may have a circular shape or an oval shape. The first contact hole 21 may expose a portion of the substrate 11. The first contact hole 21 may have a diameter that is controlled into a predetermined line width. The first contact hole 21 may expose a portion of the active region 13. For example, the first contact hole 21 may expose the first impurity region 19. The first contact hole 21 may have a longer diameter than the width of a short axis of the active region 13. Therefore, the first impurity region 19, the isolation layer 12, and a portion of the gate capping layer 18 may be etched through the etch process for forming the first contact hole 21. In other words, the gate capping layer 18, the first impurity region 19, and the isolation layer 12 may be recessed in a predetermined depth by the first contact hole 21. As a result, the bottom portion of the first contact hole 21 may be extended into the inside of the substrate 11. As the first contact hole 21 is extended, the surface of the first impurity region 19 may be recessed, and the surface of the first impurity region 19 may be positioned at a lower level than the surface of the active region 13.

Figure 5C:
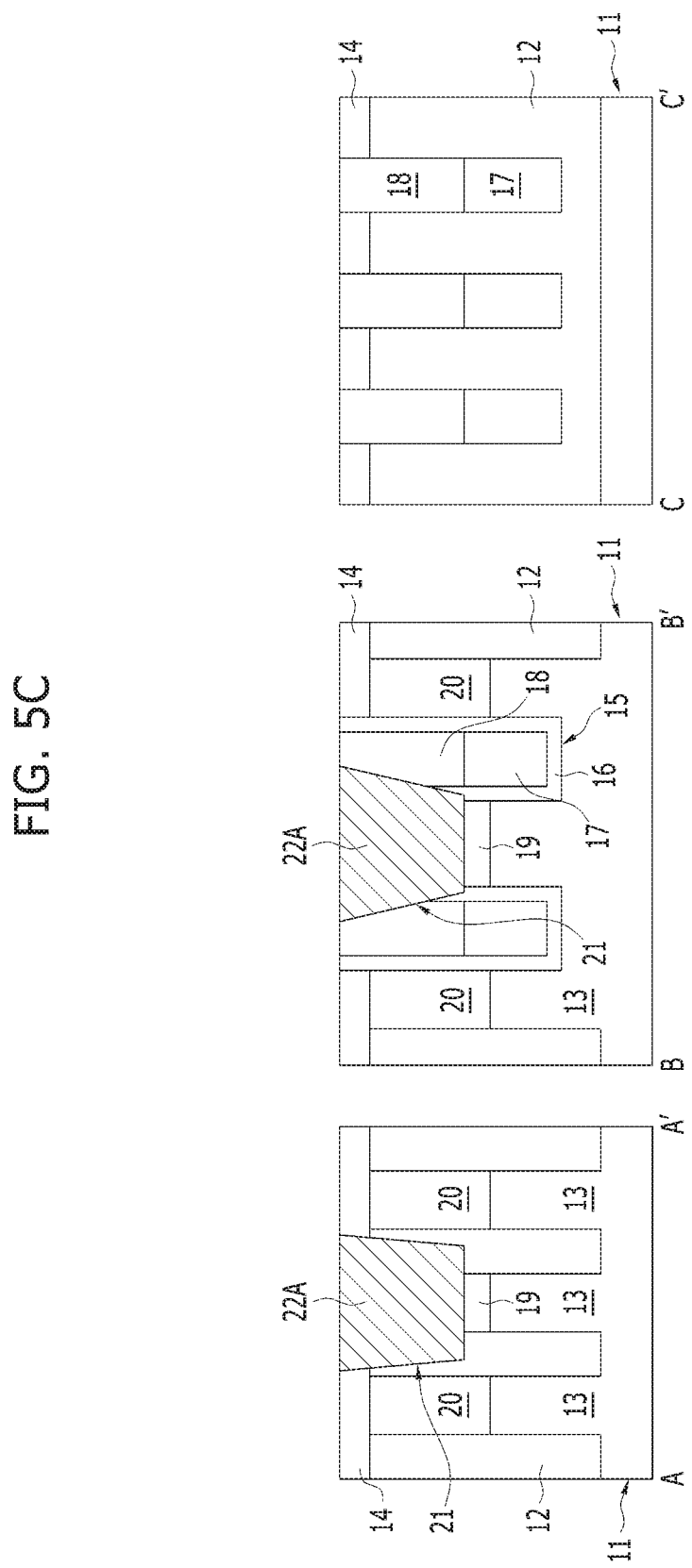

Referring to FIGS. 4C and 5C, a preliminary plug 22A may be formed to fill the first contact hole 21. The preliminary plug 22A may be formed through a Selective Epitaxial Growth (SEG) process. For example, the preliminary plug 22A may include SEG-SiP. In short, the preliminary plug 22A may be formed without voids through the SEG process. According to another embodiment of the present invention, the preliminary plug 22A may be formed through a poly-silicon layer deposition process and the CMP process. The preliminary plug 22A may fill the first contact hole 21. The top surface of the preliminary plug 22A may be positioned at the same level as the top surface of the hard mask layer 14.

Figure 5D:
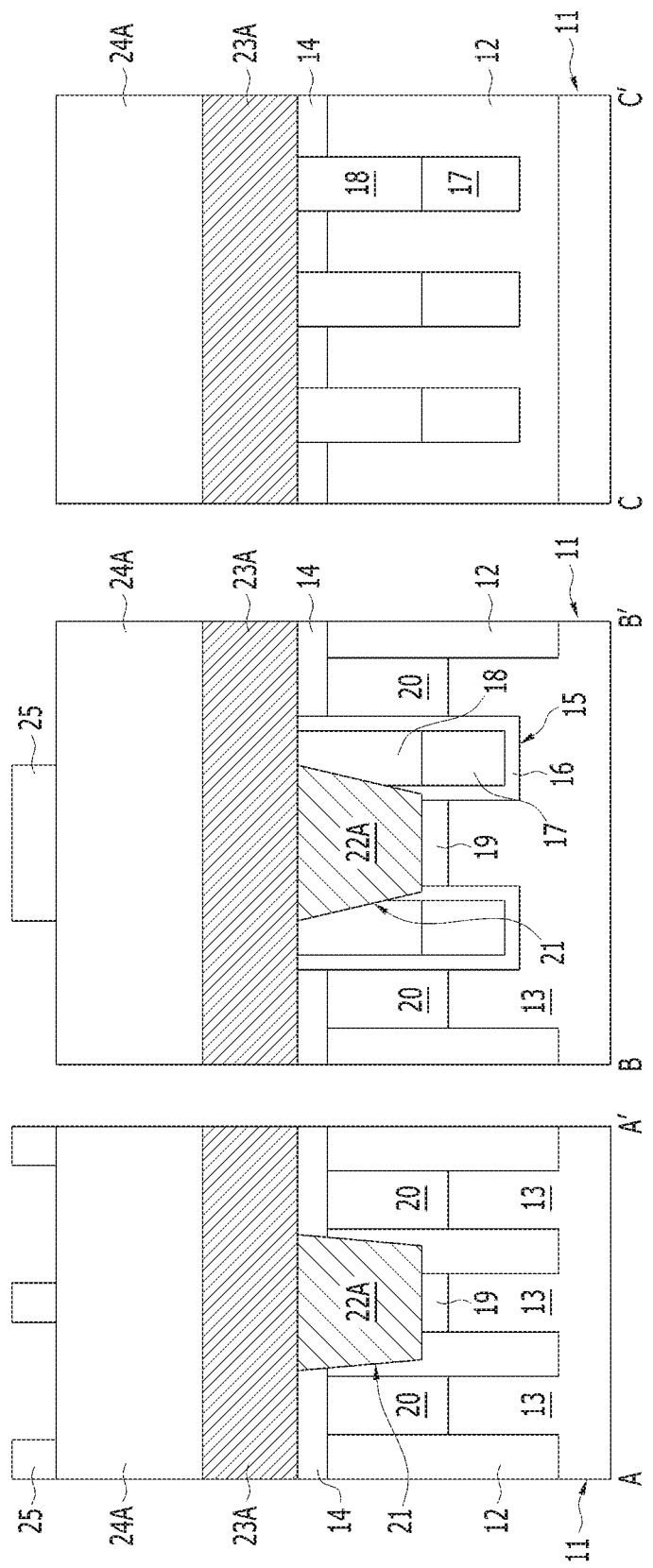

Referring to FIGS. 4D and 5D, a bit line conductive layer 23A and a bit line hard mask layer 24A may be stacked. The bit line conductive layer 23A and the bit line hard mask layer 24A may be sequentially stacked over the preliminary plug 22A and the hard mask layer 14. The bit line conductive layer 23A may be made of or include a metal or a metal-containing material. The bit line conductive layer 23A may be made of or include a metal, a metal nitride, a metal silicide, or a combination thereof. According to an embodiment of the present invention, the bit line conductive layer 23A may be made of or include tungsten (W). According to another embodiment of the present invention, the bit line conductive layer 23A may be formed of or include a stacked structure of a titanium nitride/tungsten (TiN/W). Herein, the titanium nitride may serve as a barrier. The bit line hard mask layer 24A may be formed of a dielectric material having an etch selectivity with respect to the bit line conductive layer 23A and the preliminary plug 22A. The bit line hard mask layer 24A may be made of or include a silicon oxide or a silicon nitride. According to the embodiment of the present invention, the bit line hard mask layer 24A may be formed of a silicon nitride.

A bit line mask layer 25 may be formed over the bit line hard mask layer 24A. The bit line mask layer 25 may include a photoresist pattern. The bit line mask layer 25 may be formed through a patterning method such as Spacer Patterning Technology (SPT) and Double Patterning Technology (DPT). From a perspective view of a top view, the bit line mask layer 25 may have a shape of a plurality of spaced apart lines extending in one direction.

Referring to FIGS. 4E and 5E, a bit line 23 and a bit line contact plug 22 may be formed. The bit line 23 and the bit line contact plug 22 may be concurrently formed. The bit line 23 and the bit line contact plug 22 may be concurrently formed through an etch process using the bit line mask layer 25.

The bit line hard mask layer 24A and the bit line conductive layer 23A may be etched by using the bit line mask layer 25 as an etch barrier. As a result, a bit line structure including the bit line 23 and the bit line hard mask 24 may be formed. The bit line 23 may be formed by etching the bit line conductive layer 23A. The bit line hard mask 24 may be formed by etching the bit line hard mask layer 24A.

Subsequently, the preliminary plug 22A may be etched in the same line width as the line width of the bit line 23. As a result, the bit line contact plug 22 may be formed. The bit line contact plug 22 may be formed over the first impurity region 19. The bit line contact plug 22 may couple the first impurity region 19 and the bit line 23 to each other. The bit line contact plug 22 may be formed inside the first contact hole 21. The line width of the bit line contact plug 22 may be shorter than the diameter of the first contact hole 21. Therefore, a gap G may be formed around the bit line contact plug 22.

As described above, when the bit line contact plug 22 is formed, the gap G is also formed inside the first contact hole 21. This is because the bit line contact plug 22 is formed by being etched to be smaller than the diameter of the first contact hole 21. The gap G is not formed to surround the bit line contact plug 22 but formed independently on both sidewalls of the bit line contact plug 22. Hence, one bit line contact plug 22 and a pair of gaps G may be disposed inside the first contact hole 21, and the pair of the gaps G may be isolated from each other by the bit line contact plug 22. The bottom surface of the gap G may be extended into the inside of the isolation layer 12. In short, the bottom surface of the gap G may be positioned at a lower level than the recessed upper surface of the first impurity region 19.

The stacked structure including the bit line contact plug 22, the bit line 23 and the bit line hard mask 24 sequentially stacked may be referred to as a bit line structure. From a perspective view of a top view, the bit line structure may be a pattern of a plurality of spaced apart lines.

Then the bit line mask layer 25 may be removed.

Figure 5F:
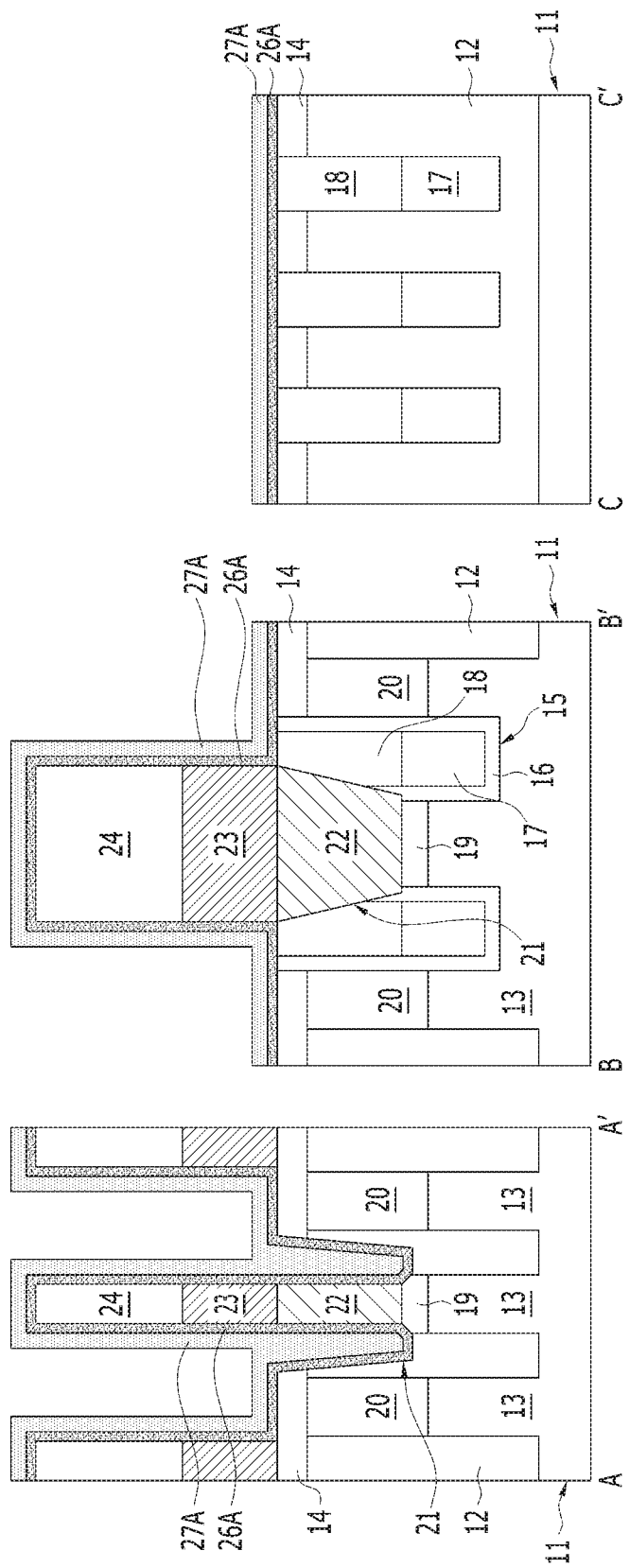

Referring to FIGS. 4F and 5F, a bit line spacer layer 26A may be formed. The bit line spacer layer 26A may cover both sidewalls of the bit line contact plug 22 and both sidewalls of the bit line 23. The bit line spacer layer 26A may also cover both sidewalls and the top surface of the bit line hard mask 24. The bit line spacer layer 26A may be made of or include a silicon oxide or a silicon nitride.

Subsequently, a sacrificial spacer layer 27A may be formed conformally over the bit line spacer layer 26A. The sacrificial spacer layer 27A may include a material having an etch selectivity with respect to the bit line spacer layer 26A. The sacrificial spacer layer 27A may be made of or include a metal nitride. Hereafter, according to an embodiment of the present invention, the sacrificial spacer layer 27A may be made of or include a titanium nitride. A portion of the sacrificial spacer layer 27A may fill a gap (which is the gap G in FIG. 5E) over the bit line spacer layer 26A.

Hereafter, for the sake of convenience in description, the reference numeral for a structure of the lower portion including the bit line 23 is omitted.

Figure 5G:
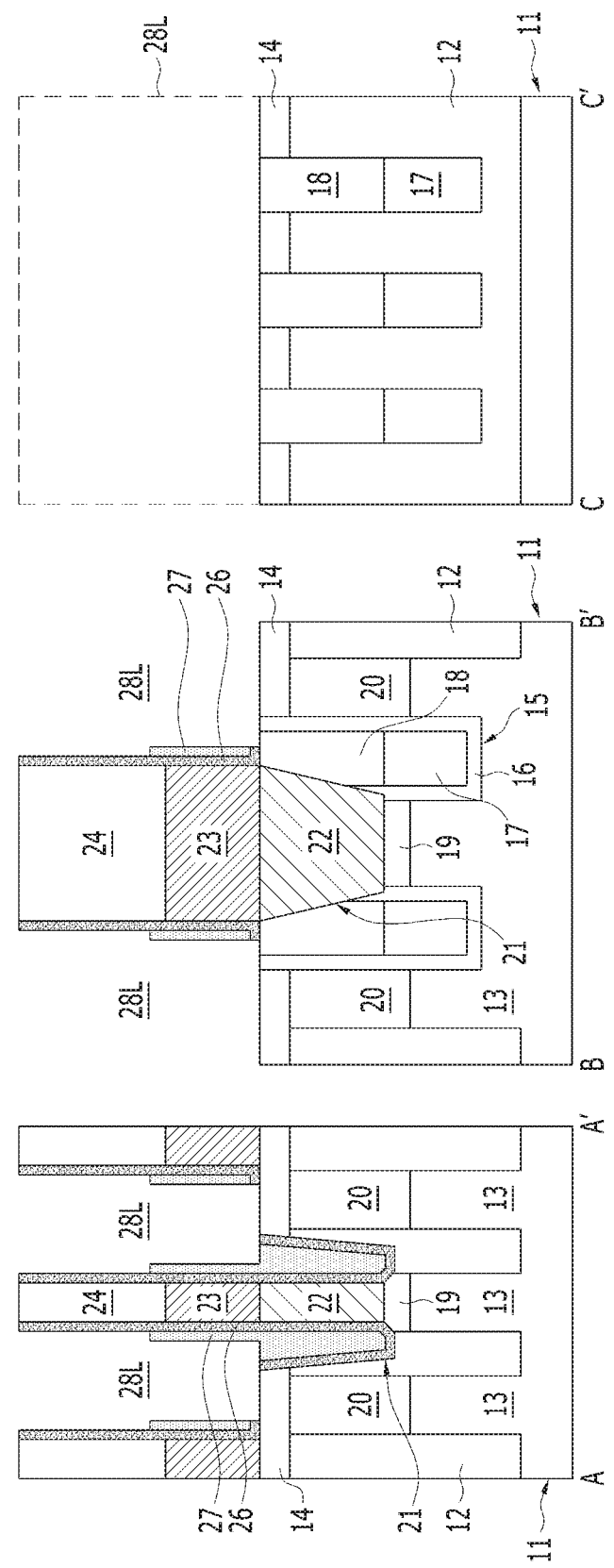

Referring to FIGS. 4G and 5G, a sacrificial spacer 27 may be formed. To form the sacrificial spacer 27, an etch-back process may be performed onto the sacrificial spacer layer 27A. After the sacrificial spacer 27 is formed, a bit line spacer 26 may be formed. To form the bit line spacer 26, the bit line spacer layer 26A may be etched back. As a result, the bit line spacer layer 26A may be selectively removed from the top surface of the bit line hard mask 24 and the top surface of the hard mask layer 14. The bit line spacer 26 may have a linear shape that is extended in parallel along both sidewalls of the bit line 23. The lower portion of the bit line spacer 26 may cover both sidewalls of the bit line contact plug 22.

As described above, after the sacrificial spacer 27 is formed, a line-type opening 28L may be defined between the neighboring bit lines 23. The line-type opening 28L may be in parallel with the bit line 23. The hard mask layer 14 may be exposed through the bottom surface of the line-type opening 28L.

The uppermost surface of the sacrificial spacer 27 may be positioned at a lower level than the top surface of the bit line hard mask 24. The uppermost surface of the sacrificial spacer 27 may be positioned at the same level as or a higher level than the top surface of the bit line 23. The bottom portion of the sacrificial spacer 27 may fill a gap (which is the gap G in FIG. 4E) over the bit line spacer layer 26.

Figure 5H:
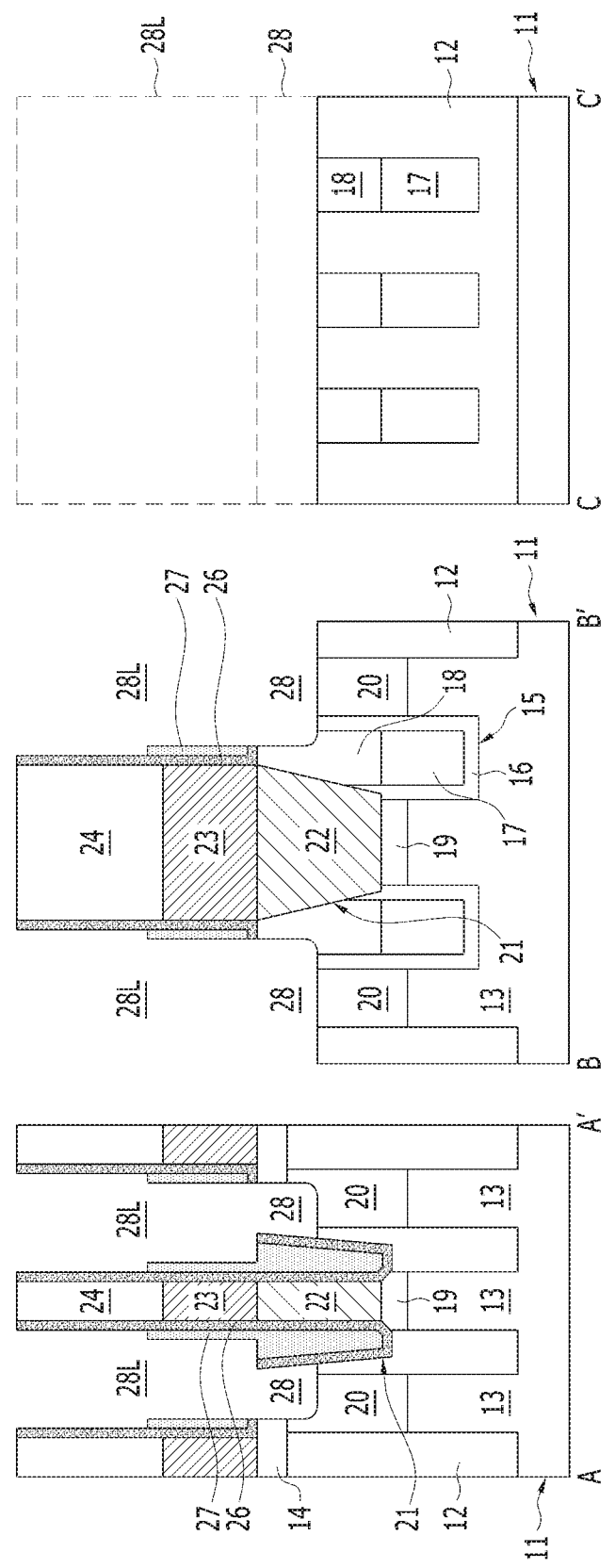

Referring to FIGS. 4H and 5H, the lower materials may be etched to be self-aligned to the sacrificial spacer 27. As a result, a recess 28 may be formed below the line-type opening 28L. To form the recess 28, the lower portion of the bit line spacer 26, the isolation layer 12, the gate capping layer 18, and the second impurity region 20 may be etched in a predetermined depth. The recess 28 may be extended into the inside of the substrate 11. The bottom surface of the recess 28 may be positioned at a lower level than the top surface of the bit line contact plug 22. The bottom surface of the recess 28 may be positioned at a higher level than the bottom surface of the bit line contact plug 22.

The recess 28 may have a linear shape that is extended in one direction, just as the line-type opening 28L does. From a perspective top view, the recess 28 may concurrently expose the neighboring second impurity regions 20 of the active region 13. Also, the recess 28 may expose the isolation layer 12 between the active regions 13.

Figure 5I:
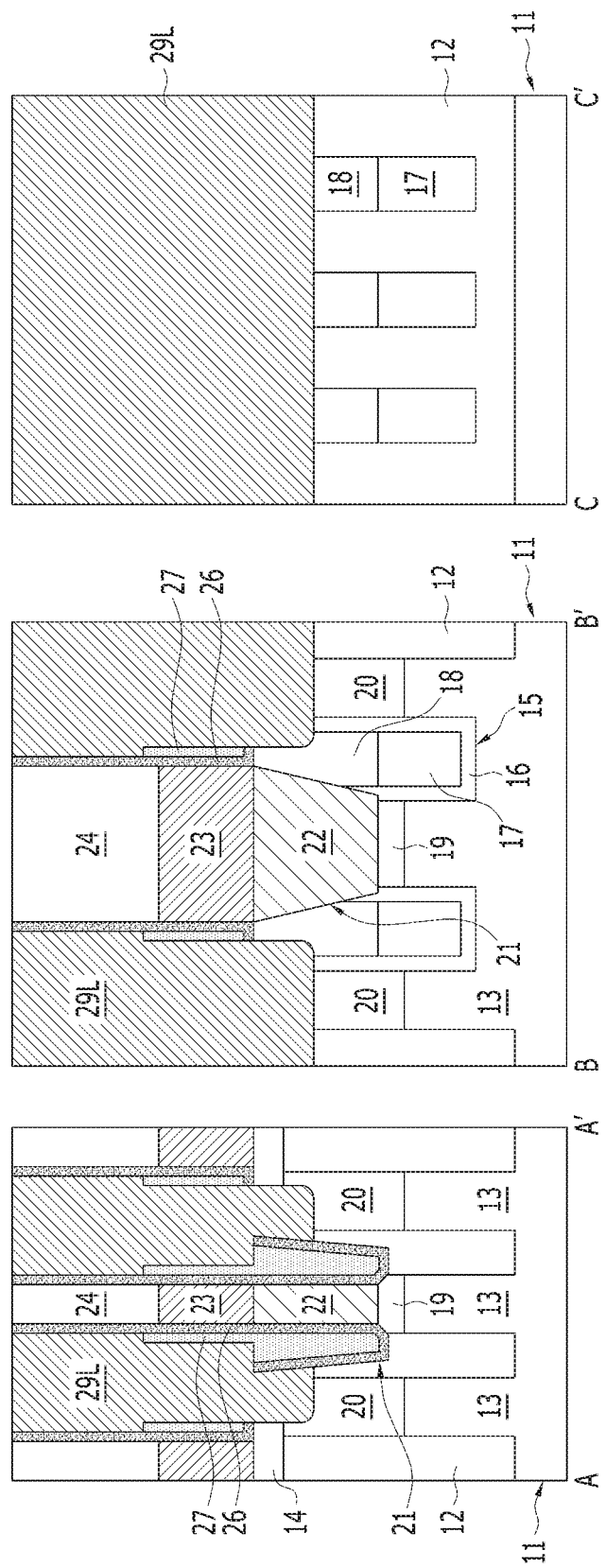

Referring to FIGS. 4I and 5I, a line-type plug 29L may be formed. The line-type plug 29L may fill the line-type opening 28L and the recess 28. The line-type plug 29L may be formed between the neighboring bit lines 23. The bit line spacer 26 and the sacrificial spacer 27 may be positioned between the line-type plug 29L and the bit lines 23. The bit line spacer 26 may be positioned between the bit line hard mask 24 and the line-type plug 29L. The bit line spacer 26 and the sacrificial spacer 27 may be positioned between the bit line contact plug 22 and the line-type plug 29L.

The top surface of the line-type plug 29L and The top surface of the bit line hard mask 24 may be positioned at the same level.

To line-type plug 29L may be formed by depositing a polysilicon layer to fill the line-type opening 28L and then performing an etch-back process onto the polysilicon layer. The line-type plug 29L may have a line shape. The line-type plug 29L may be a polysilicon pattern of a line shape. The line-type plug 29L may be in parallel with the bit line 23. The line-type plug 29L may couple the neighboring second impurity regions 20 of the active region 13.

The bottom portion of the line-type plug 29L may extend inside and be in contact with the active region 13. For example, the bottom portion of the line-type plug 29L may be coupled to the second impurity region 20.

Figure 5J:
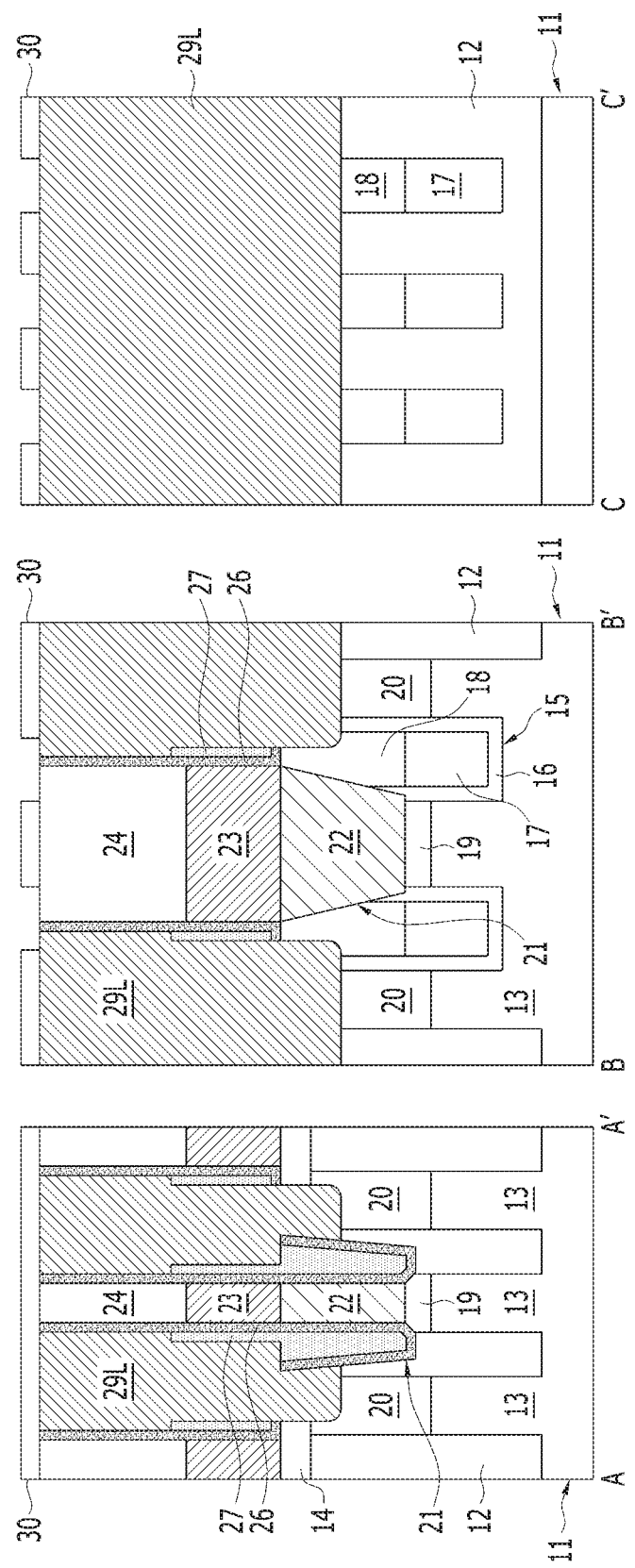

Referring to FIGS. 4J and 5J, a mask layer 30 may be formed. The mask layer 30 may be formed over the line-type plug 29L. The mask layer 30 may include a photoresist pattern. According to an embodiment of the present invention, the mask layer 30 may be formed of or include a material having an etch selectivity with respect to the line-type plug 29L. For example, the mask layer 30 may be a silicon oxide.

The mask layer 30 may be extended in a direction crossing the line-type plug 29L. The mask layer 30 may have a pattern of a plurality of spaced apart lines. The mask layer 30 may expose a portion of the top surface of the line-type plug 29L. Also, the mask layer 30 may expose a portion of the bit line hard mask 24.

Figure 5K:
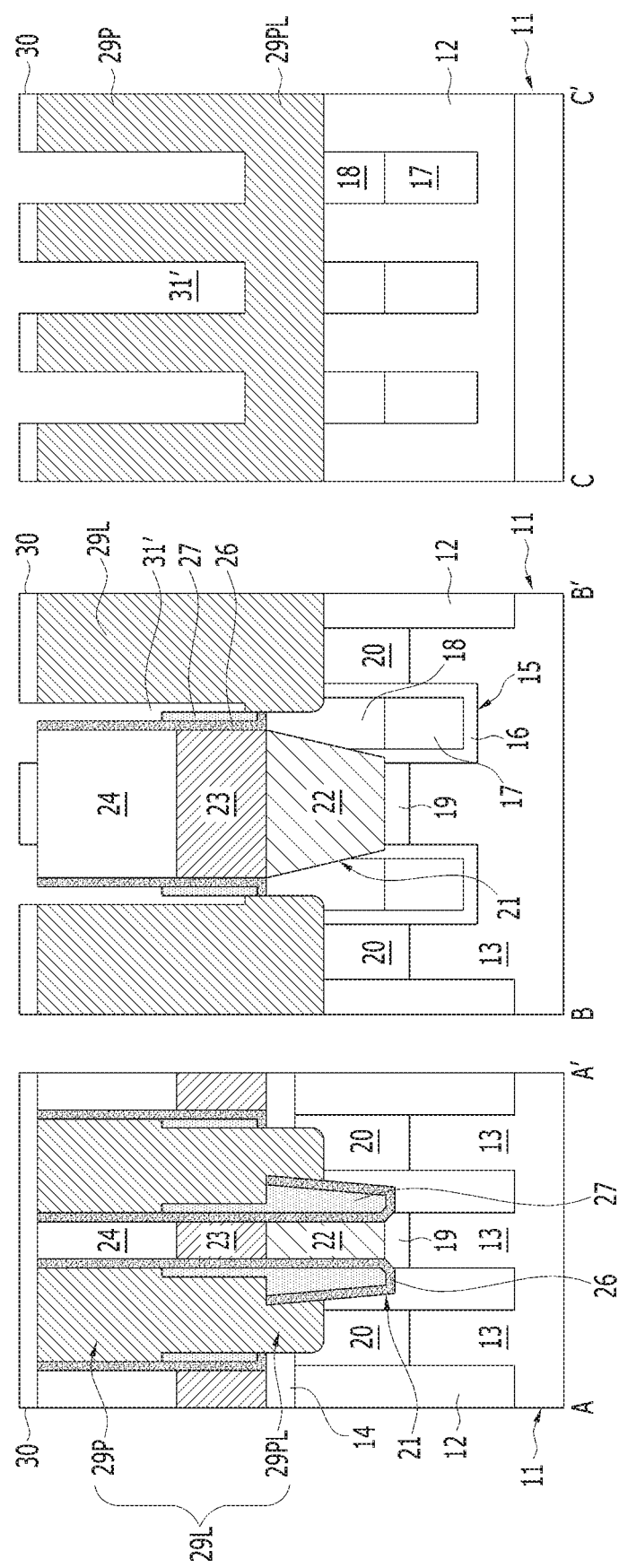

Referring to FIGS. 4K and 5K, a plug partial separation process may be performed. For example, the line-type plug 29L may be etched. For example, the line-type plug 29L may be etched by using the mask layer 30 as an etch barrier. As a result, a plurality of pillar-type plugs 29P may be formed between the neighboring bit line structures BL. A preliminary plug isolation opening 31' may be formed between the pillar-type plugs 29P. The preliminary plug isolation opening 31' may be formed on both sidewalls of the bit line structure. The line-type plug may remain under the pillar-type plugs 29P. The remaining line-type plug may be simply referred to as 'a line-type plug body 29PL'. The line-type plug body 29PL may have a linear shape that commonly contacts the neighboring second impurity regions 20 of the active region 13.

Figure 5L:
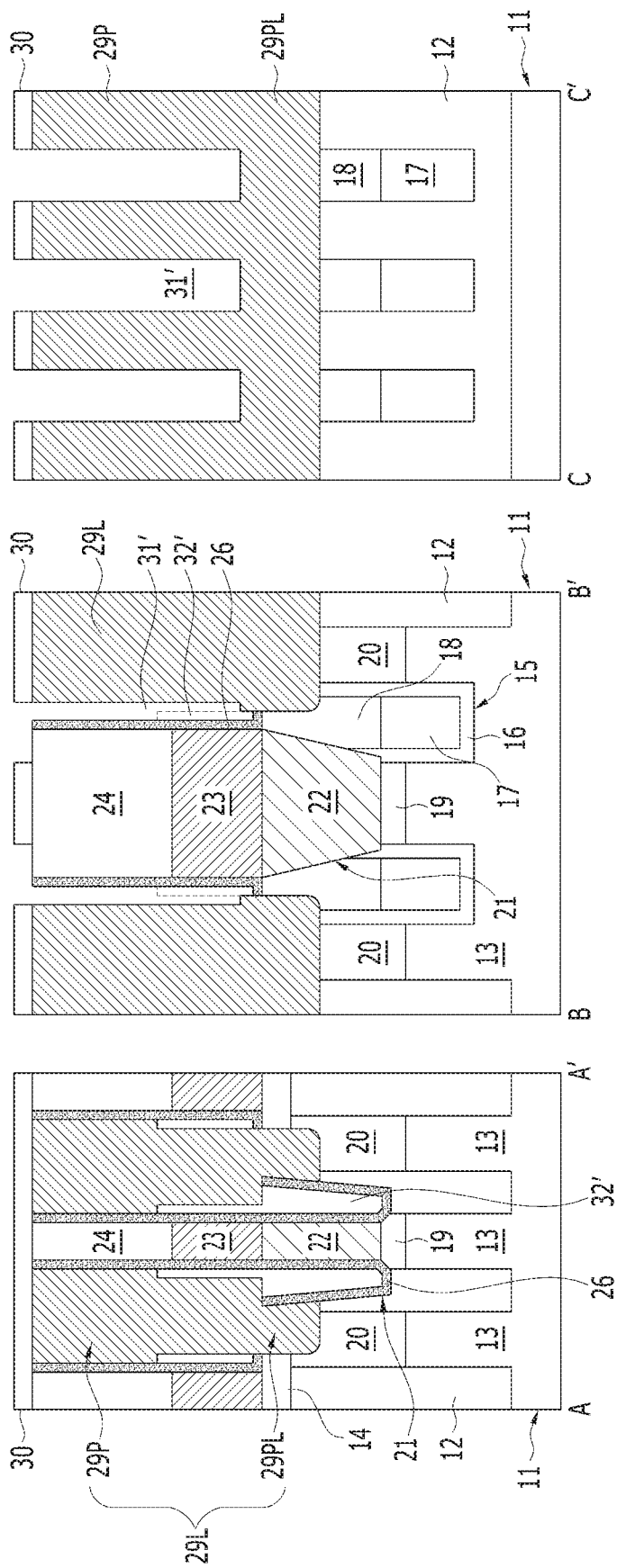

Referring to FIGS. 4L and 5L, the sacrificial spacer 27 may be removed. The sacrificial spacer 27 may be removed through a wet dip-out process. For example, the sacrificial spacer 27 may be removed by applying a chemical through the preliminary plug isolation opening 31'. Since the width of the preliminary plug isolation opening 31' is big, the path for applying/discharging the chemical is wide and short. Therefore, the sacrificial spacer 27 may be removed easily.

As the sacrificial spacer 27 is removed, a line-type air gap 32' may be formed. The line-type air gap 32' may be positioned between the pillar-type plug 29P and the bit line 23 with the bit line spacer 26 between them. Also, the line-type air gap 32' may be formed between the line-type plug body 29PL and the bit line contact plug 22 with the bit line spacer 26 between them. The line-type air gap 32' may not be positioned between the pillar-type plug 29P and the bit line hard mask 24 except for a bottom part of the bit line hard mask 24. The bit line spacer 26 may be positioned between the pillar-type plug 29P and the bit line hard mask 24.

The line-type air gap 32' may have a linear shape that is in parallel with both sidewalls of the bit line 23. The line-type air gap 32' may be extended to be positioned on both sides of the bit line contact plug 22. As a result, the initial air gap, which is the line-type air gap 32', may be formed in the space from which the sacrificial spacer 27 is removed.

Figure 5M:
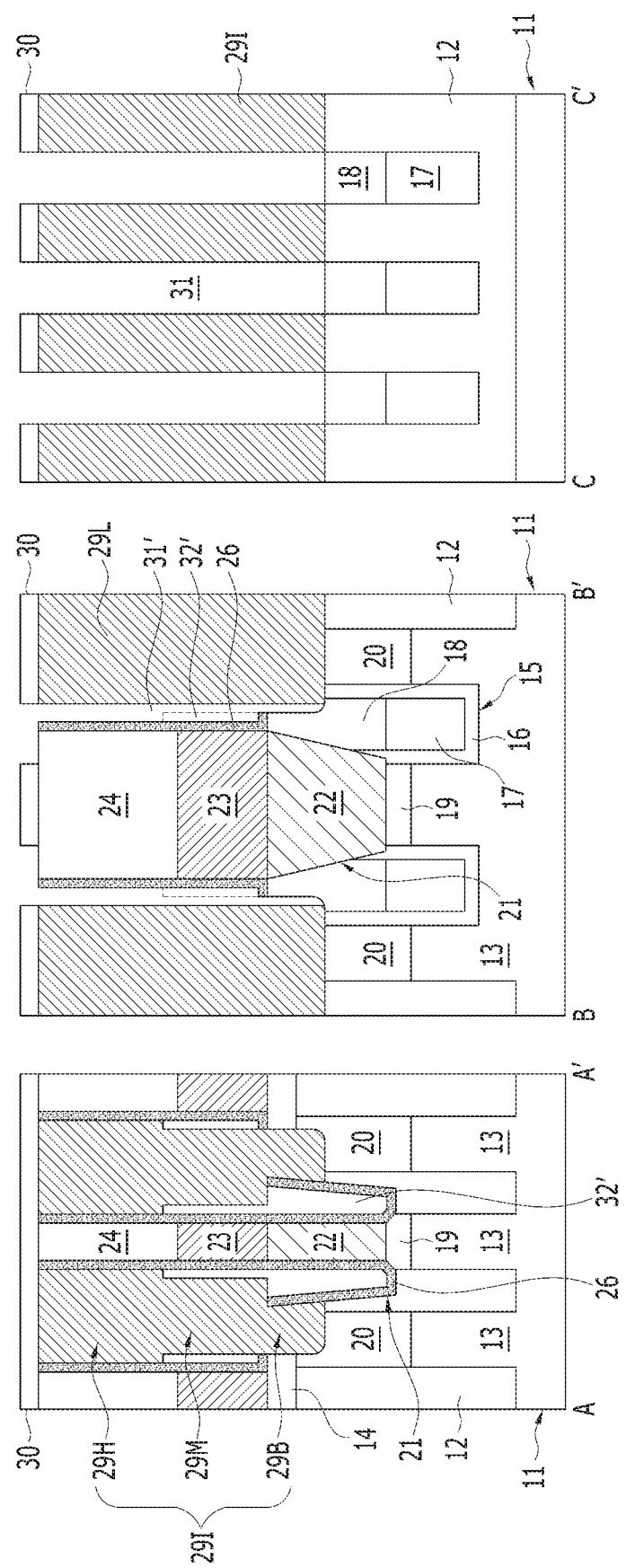

Referring to FIGS. 4M and 5M, a plug cutting process may be performed. For example, the line-type plug body 29PL below the preliminary plug isolation opening 31' may be cut. The plug cutting process may be referred to as a full plug separation process. The line-type plug body 29PL may be cut through an etch process using the mask layer 30. As the line-type plug body 29PL is cut, the preliminary plug isolation opening 31' may be extended. In short, the extended preliminary plug isolation opening 31' may be a plug separation opening 31 that exposes the second impurity region 20. Since the line-type plug body 29PL is cut, a conductive residue may be removed. As a result, the bridge caused by a conductive residue may be prevented. Also, through the plug cutting process, a chemical remaining after the wet dip-out process may be removed.

By cutting the line-type plug body 29PL, a plurality of island-type plug 29I may be formed between the neighboring bit line structures when looked from the perspective of the line C-C'. The line-type air gap 32' may be disposed between the island-type plug 29I and the bit line 23. The island-type plug 29I may include a bottom portion 29B, a middle portion 29M, and a head portion 29H that are stacked and extend vertically. The bottom portion 29B may be formed by cutting the line-type plug body 29PL. The middle portion 29M and the head portion 29H may be defined by the pillar-type plugs 29P (refer to FIG. 5L). The middle portion 29M and the head portion 29H may have a 'T' shape.

The head portion 29H of the island-type plug 29I may have a relatively wider surface area than the middle portion 29M. The middle portion 29M may be adjacent to the line-type air gap 32', and the head portion 29H may cover the upper portion of the line-type air gap 32'. The bottom portion 29B of the island-type plug 29I may be adjacent to the bit line contact plug 22. The middle portion 29M of the island-type plug 29I may be adjacent to the bit line 23. The head portion 29H of the island-type plug 29I may be adjacent to the bit line hard mask 24. The line-type air gap 32' may be disposed between the middle portion 29M of the island-type plug 29I and the bit line 23. The line-type air gap 32' may be extended to be disposed between the bottom portion 29B of the island-type plug 29I and the bit line contact plug 22. The line-type air gap 32' may not be disposed between the head portion 29H of the island-type plug 29I and the bit line hard mask 24.

Through a series of processes that are described above, the plug partial separation process, the wet dip-out process, and the plug cutting process may be sequentially performed so as to form the island-type plug 29I and the line-type air gap 32'.

According to another embodiment of the present invention, the line-type air gap 32' may be formed after the island-type plug 29I and a plug isolation opening 31 which are formed concurrently. For example, the island-type plug 29I may be formed by etching all the line-type plug 29L through the plug isolation process. Subsequently, the line-type air gap 32' may be formed by removing the sacrificial spacer 27. In this case, the plug cutting process may be omitted.

Figure 5N:
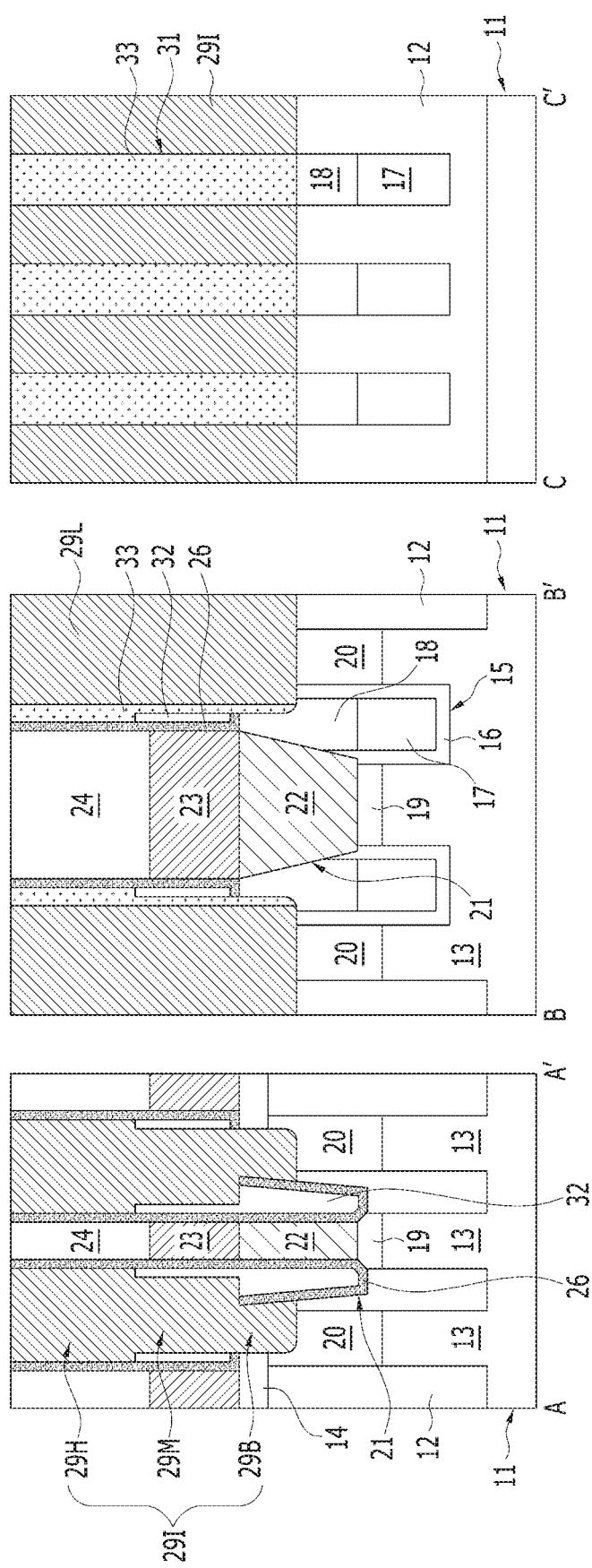
Figure 50:
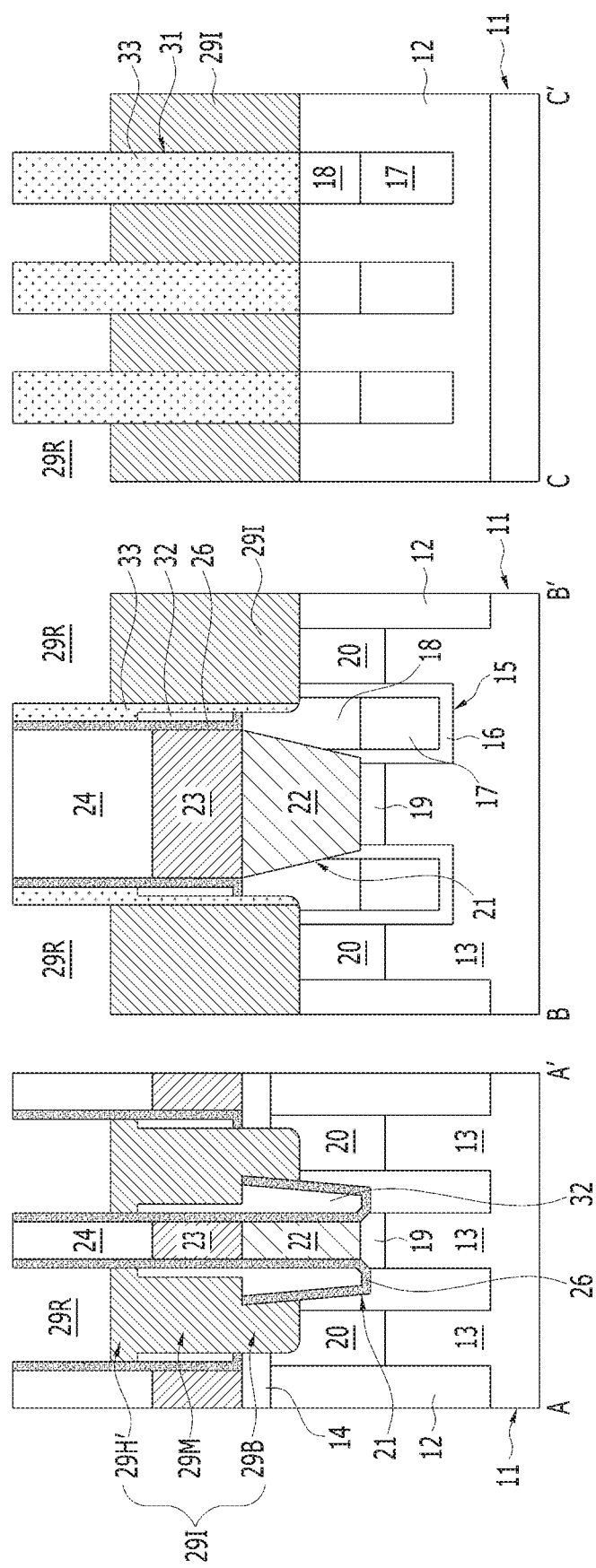

Referring to FIGS. 4N and 5N, a plug isolation layer 33 may be formed inside the plug isolation opening 31. The plug isolation layer 33 may be formed by depositing a nitride to fill the plug isolation opening 31 followed by a planarization process. From the perspective of the line C-C', the plug isolation layer 33 may be disposed between the island-type plugs 29I. During the planarization process for forming the plug isolation layer 33, the mask layer 30 may be removed. The top surface of the plug isolation layer 33 may be positioned at the same level as the top surface of the bit line hard mask 24 and the top surface of the island-type plug 29I.

The line-type air gap 32' before the plug isolation layer 33 is formed may have a linear shape, but the line-type air gap 32' after the plug isolation layer 33 is formed may have an isolated form. This is because the plug isolation layer 33 may fill a portion of the line-type air gap 32'. After all, the line-type air gap 32' may be transformed into an air gap 32 due to the plug isolation layer 33. The air gap 32 may not be positioned between the plug isolation layer 33 and the bit line spacer 26.

The air gap 32 may be positioned between the island-type plug 29I and the bit line 23. The head portion 29H of the island-type plug 29I may cover the upper portion of the air gap 32. The air gap 32 may be positioned between the middle portion 29M of the island-type plug 29I and the bit line 23. The air gap 32 may be extended to be positioned between the bottom portion 29B of the island-type plug 29I and the bit line contact plug 22. The air gap 32 may not be positioned between the head portion 29H of the island-type plug 29I and the bit line hard mask 24 except for the bottom part of the bit line hard mask 24.

As the air gap 32 is formed between the island-type plug 29I and the bit line 23, parasitic capacitance between the island-type plug 29I and the bit line 23 may be reduced. Also, as the air gap 32 is formed between the island-type plug 29I and the bit line contact plug 22, parasitic capacitance between the island-type plug 29I and the bit line contact plug 22 may be reduced.

Referring to FIGS. 4O and 5O, the head portion 29H of the island-type plug 29I may be recessed in a predetermined depth. As a result, the island-type plug 29I may include a head portion 29H' whose height is decreased. The surface of the head portion 29H' of the island-type plug 29I may be positioned at a lower level than the top surface of the bit line hard mask 24. A plug recess portion 29R may be formed in the upper portion of the island-type plug 29I. The plug recess portion 29R may not expose the air gap 32.

Figure 5P:
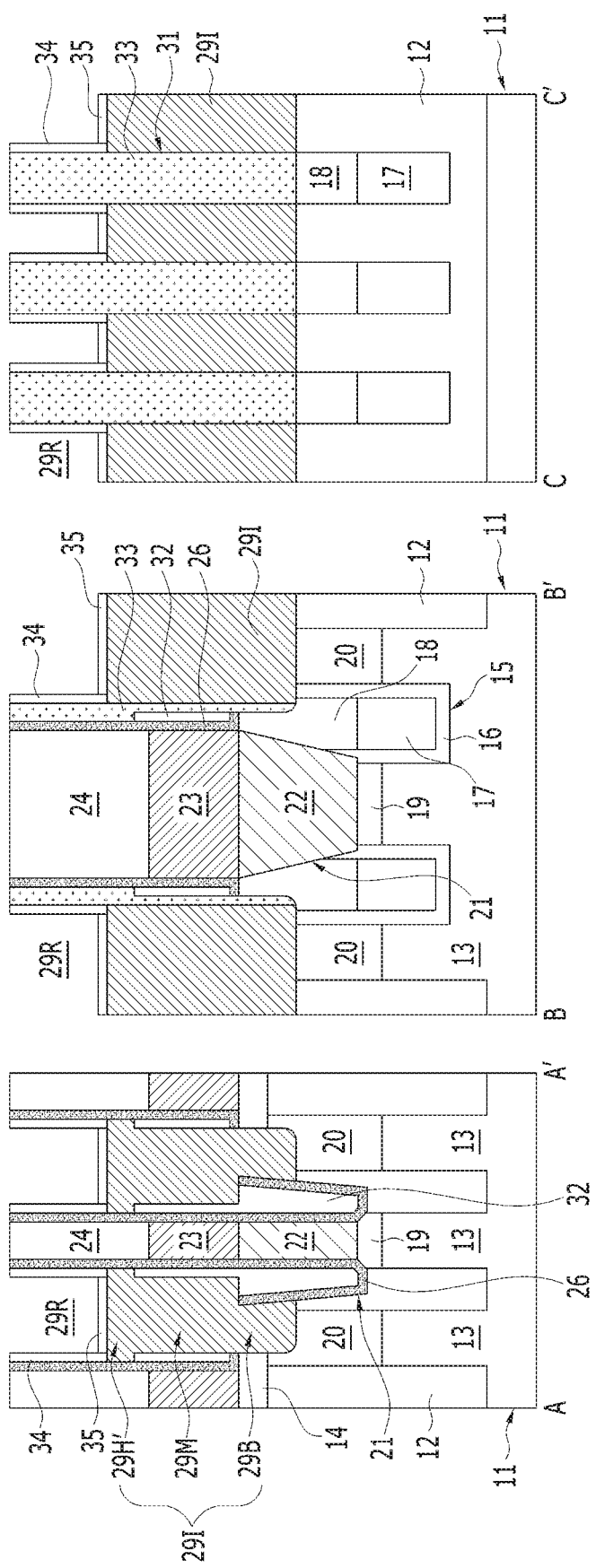

Referring to FIGS. 4P and 5P, a surrounding spacer 34 may be formed. The surrounding spacer 34 may be formed conformally over the profile of the substrate structure including the plug recess portion 29R by depositing a dielectric material over the profile of the substrate structure including the plug recess portion 29R and performing an etch-back process. As a result, the surface of the head portion 29H' of the island-type plug 29I may be exposed, and the surrounding spacer 34 may surround the sidewalls of the plug recess portion 29R. The surrounding spacer 34 may be formed or include a nitride. The surrounding spacer 34 may contact the bit line spacer 26. The surrounding spacer 34 may contact the plug isolation layer 33.

Subsequently, an ohmic contact layer 35 may be formed on the surface of the head portion 29H' of the island-type plug 29I. The ohmic contact layer 35 may be made of or include a metal silicide. The ohmic contact layer 35 may be formed by depositing a silicidable metal layer and performing an annealing process. As a result, a silicidation reaction may occur on the interface between the silicidable metal layer and the island-type plug 29I so as to form a metal silicide layer. The ohmic contact layer 35 may include a cobalt silicide. According to the embodiment of the present invention, the ohmic contact layer 35 may include a cobalt silicide of a $CoSi_2$ phase.

When a cobalt silicide of a $CoSi_2$ phase is formed as the ohmic contact layer 35, a low-resistivity cobalt silicide may be formed and contact resistance may also be improved.

Since the head portion 29H' of the island-type plug 29I has a wide surface area, the contact resistance between the island-type plug 29I and the ohmic contact layer 35 may be improved.

Referring to FIGS. 4Q and 5Q, an upper plug 36 may be formed over the ohmic contact layer 35. The upper plug 36 may be formed by gap-filling a metal material (not shown) and performing a planarization process. The upper plug 36 may be formed by filling the plug recess portion 29R (refer to FIG. 5P) over the ohmic contact layer 35. The upper plug 36 may be made of or include a metal-containing layer. The upper plug 36 may be formed of or include a material containing tungsten. The upper plug 36 may be formed of or include a tungsten layer or a tungsten compound.

As described above, the stacked structure of the island-type plug 29I, the ohmic contact layer 35, and the upper plug 36 may be simply referred to as 'a storage node contact plug (SNC)'. Since the island-type plug 29I is made of polysilicon and the ohmic contact layer 35 and the upper plug 36 is made of a metal material, the storage node contact plug (SNC) may be called a hybrid plug or a semi-metal plug.

Although not illustrated, a memory element may be formed over the upper plug 36 (refer to a reference numeral '230' of FIG. 2A).

According to the embodiment of the present invention, since the air gap 32 is formed between the island-type plug 29I and the bit line contact plug 22 as soon as the air gap 32 is formed between the island-type plug 29I and the bit line 23, the parasitic capacitance may be decreased. Since the parasitic capacitance is decreased, the sensing margin of the device may be improved.

Also, since a plug cutting process is performed after a dip-out process for forming the line-type air gap 32', the chemical used for the dip-out process is readily removed and does not remain in the structure which may be detrimental to the properties of the structure. In short, the chemical remaining after the dip-output process may be removed during the plug cutting process.

Also, since the air gap 32 is formed after the plug isolation process, the air gap 32 may be prevented from a procedural defect. For example, it is possible to prevent loss of the bit line spacer 26 and prevent an impurity from going back to the inside of the air gap 32.

Also, since the air gap 32 is formed after the plug isolation process, not only the capping efficiency of the air gap 32 may be increased, but also the thickness of the air gap 32 may be increased.

Also, since the island-type plug 29I is formed after the line-type plug 29L is formed, the contact resistance between the island-type plug 29I and the active region 13 may be improved.

Also, since the head portion 29H of the island-type plug 29I has a wide surface area, the contact resistance between the island-type plug 29I and the ohmic contact layer 35 may be improved.

Figure 6:
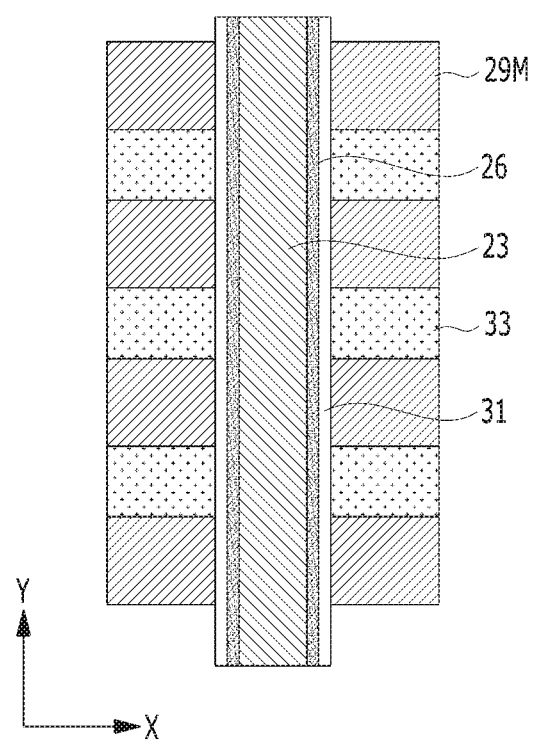
FIG. 6 illustrates a semiconductor device in accordance with another embodiment of the present invention.

FIG. 6 illustrates a semiconductor device in accordance with another embodiment of the present invention.

Referring to FIG. 6, an air gap 31 may have a linear shape that is extended in parallel with the sidewall of the bit line 23. For example, the air gap 31 may be extended in a Y direction. The air gap 31 may have a linear shape that is disposed between the bit line 23 and the middle portion 29M of the island-type plug.

According to the embodiments of the present invention, parasitic capacitance may be reduced by forming an air gap between a bit line and a storage node contact plug.

According to the embodiments of the present invention, parasitic capacitance may be reduced by forming an air gap between a bit line contact plug and a storage node contact plug.

Since the air gap is formed after a plug isolation process, a procedural defect may be prevented from occurring in the air gap. Also, since the air gap is formed after a plug isolation process, not only the capping efficiency of the air gap may be increased but also the thickness of the air gap may be increased.

Since an island-type plug is formed after the formation of a line-type plug, contact resistance between the island-type plug and an active region may be improved.

Since the head of the island-type plug has a wide surface area, contact resistance between the island-type plug and an ohmic contact layer may be improved.

While the present invention has been described with respect to specific embodiments, it will be apparent to those skilled in the art to which the present invention belongs that various changes and modifications may be made without departing from the spirit and scope of the invention as defined in the following claims.

What is claimed is:

1. A semiconductor device, comprising:
a plurality of bit line structures formed over a semiconductor substrate to be spaced apart from each other;
a bit line spacer formed on both sidewalls of each of the bit line structures;
a plurality of island-type plugs formed between the bit line structures to contact the semiconductor substrate;
a plug isolation layer formed between the island-type plugs; and
a plurality of air gaps formed between the island-type plugs and the bit line spacer,
wherein each of the air gaps are isolated-type air gaps disposed between the bit line structures and the island-type plugs,
wherein each of the island-type plugs is comprising a head portion directly capping an upper portion of the air gaps, and
wherein an upper surface of the head portion is disposed at a lower level than upper surfaces of the bit line structures.

2. The semiconductor device of claim 1, wherein each of the bit line structures includes:
a bit line contact plug over the semiconductor substrate;
a bit line over the bit line contact plug; and
a bit line hard mask layer over the bit line.

3. The semiconductor device of claim 2, wherein each of the air gaps is formed between the bit line and the island-type plugs to be extended to be disposed between the bit line contact plug and the island-type plugs.

4. The semiconductor device of claim 3, wherein each of the island-type plugs further comprises:
a bottom portion which is adjacent to the bit line contact plug with the air gaps therebetween; and
a middle portion which is disposed over the bottom portion to be adjacent to the bit line with the air gaps therebetween,
wherein the head portion is disposed over the middle portion to contact the bit line spacer while capping the upper portion of the air gaps.

5. The semiconductor device of claim 1, wherein the island-type plugs include a polysilicon layer.

6. The semiconductor device of claim 1, further comprising:
an ohmic contact layer formed on the head portion of the island-type plugs; and
a metal plug formed over the ohmic contact layer, and
a surrounding spacer suitable for surrounding sidewalls of the metal plug,
wherein an upper surface of the metal plug and the upper surfaces of the bit line structures are at the same level.

7. The semiconductor device of claim 1, further comprising:
an isolation layer which is formed to define a plurality of active regions in the semiconductor substrate;
a gate trench which traverses the active regions and the isolation layer; and
a buried word line which is formed inside the gate trench.

* * * * *